(12) United States Patent
Himeda et al.

(10) Patent No.: US 11,552,020 B2
(45) Date of Patent: Jan. 10, 2023

(54) SEMICONDUCTOR COMPOSITE DEVICE AND PACKAGE BOARD USED THEREIN

(71) Applicant: Murata Manufacturing Co., Ltd., Nagaokakyo (JP)

(72) Inventors: Koshi Himeda, Nagaokakyo (JP); Tatsuya Kitamura, Nagaokakyo (JP); Chiharu Sakaki, Nagaokakyo (JP); Shinya Kiyono, Nagaokakyo (JP); Sho Fujita, Nagaokakyo (JP); Atsushi Yamamoto, Nagaokakyo (JP); Takeshi Furukawa, Nagaokakyo (JP); Kenji Nishiyama, Nagaokakyo (JP); Tatsuya Funaki, Nagaokakyo (JP); Kinya Aoki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/398,574

(22) Filed: Aug. 10, 2021

(65) Prior Publication Data

US 2021/0375841 A1   Dec. 2, 2021

Related U.S. Application Data

(63) Continuation of application No. 16/907,557, filed on Jun. 22, 2020, now Pat. No. 11,121,123, which is a
(Continued)

(30) Foreign Application Priority Data

Dec. 27, 2017  (JP) ............... JP2017-251203
Feb. 22, 2018  (JP) ............... JP2018-029690
Jun. 6, 2018   (JP) ............... JP2018-108409

(51) Int. Cl.
*H05K 1/02*   (2006.01)
*H01L 23/538*  (2006.01)
(Continued)

(52) U.S. Cl.
CPC ........ *H01L 23/5383* (2013.01); *H01L 21/486* (2013.01); *H01L 23/49827* (2013.01);
(Continued)

(58) Field of Classification Search
CPC ...... H05K 1/0262; H05K 1/023; H05K 1/162; H05K 1/165
See application file for complete search history.

(56) References Cited

U.S. PATENT DOCUMENTS 6,005,197 A   12/1999  Kola et al.
6,317,948 B1  12/2001  Kola et al.
(Continued)

FOREIGN PATENT DOCUMENTS

JP  H0888473 A    4/1996
JP  H08148839 A   6/1996
(Continued)

OTHER PUBLICATIONS

International Search Report issued for PCT/JP2018/038813, dated Dec. 25, 2018.
(Continued)

*Primary Examiner* — Sherman Ng
(74) *Attorney, Agent, or Firm* — ArentFox Schiff LLP

(57) ABSTRACT

A semiconductor composite device is provided that includes a voltage regulator, a package board, and a load, and converts an input DC voltage into a different DC voltage to supply the converted DC voltage to the load. The VR includes a semiconductor active element. The package board includes a C layer in which a capacitor is formed, and an L layer in which an inductor is formed. A plurality of through holes penetrate the C layer and the L layer in a direction perpendicular to the mounting face in the package board. The capacitor is connected to the load through the through
(Continued)

hole. The inductor is connected to the load through the through hole and to the VR through the through hole.

17 Claims, 29 Drawing Sheets

Related U.S. Application Data continuation of application No. PCT/JP2018/038813, filed on Oct. 18, 2018.

(51) Int. Cl.
*H01L 21/48* (2006.01)
*H01L 23/498* (2006.01)
*H01L 25/16* (2006.01)
*H02M 3/00* (2006.01)

(52) U.S. Cl.
CPC ............ *H01L 25/16* (2013.01); *H02M 3/003* (2021.05); *H05K 1/0262* (2013.01)

(56) References Cited

U.S. PATENT DOCUMENTS

| | | | |
|---|---|---|---|
| 7,613,007 | B2 | 11/2009 | Amey, Jr. et al. |
| 7,624,501 | B2 | 12/2009 | Machida |
| 9,320,134 | B2 | 4/2016 | Hiei et al. |
| 10,790,792 | B2 | 9/2020 | Nakaiso |
| 2002/0054470 | A1 | 5/2002 | Kuriyama |
| 2004/0130857 | A1 | 7/2004 | Miki et al. |
| 2006/0138591 | A1 | 6/2006 | Amey, Jr. et al. |
| 2008/0184555 | A1 | 8/2008 | Machida |
| 2008/0304210 | A1 | 12/2008 | Kasuga et al. |
| 2010/0246099 | A1 | 9/2010 | Naka et al. |
| 2011/0042795 | A1 | 2/2011 | Knickerbocker |
| 2011/0050334 | A1* | 3/2011 | Pan ........................ H02M 3/003 327/540 |
| 2013/0187480 | A1 | 7/2013 | Hiei |
| 2013/0257525 | A1* | 10/2013 | Kosonocky ....... H01L 23/49827 327/540 |
| 2014/0268615 | A1* | 9/2014 | Yun ........................ H05K 1/165 29/831 |
| 2015/0253790 | A1* | 9/2015 | Gallina .................. H02M 3/156 323/293 |
| 2016/0233192 | A1* | 8/2016 | Dosluoglu ............ H01L 23/528 |
| 2018/0234070 | A1 | 8/2018 | Nakaiso |
| 2020/0020652 | A1* | 1/2020 | Hill ........................ H01F 27/085 |

FOREIGN PATENT DOCUMENTS

| | | |
|---|---|---|
| JP | H11126976 A | 5/1999 |
| JP | 2001176728 A | 6/2001 |
| JP | 2002176263 A | 6/2002 |
| JP | 2003037366 A | 2/2003 |
| JP | 2004194377 A | 7/2004 |
| JP | 2004221534 A | 8/2004 |
| JP | 2004303956 A | 10/2004 |
| JP | 2005183890 A | 7/2005 |
| JP | 2006196886 A | 7/2006 |
| JP | 2007173439 A | 7/2007 |
| JP | 2008192999 A | 8/2008 |
| WO | 2012101858 A1 | 8/2012 |
| WO | 2017073438 A1 | 5/2017 |

OTHER PUBLICATIONS

Written Opinion of the International Searching Authority issued for PCT/JP2018/038813, dated Dec. 25, 2018.

* cited by examiner

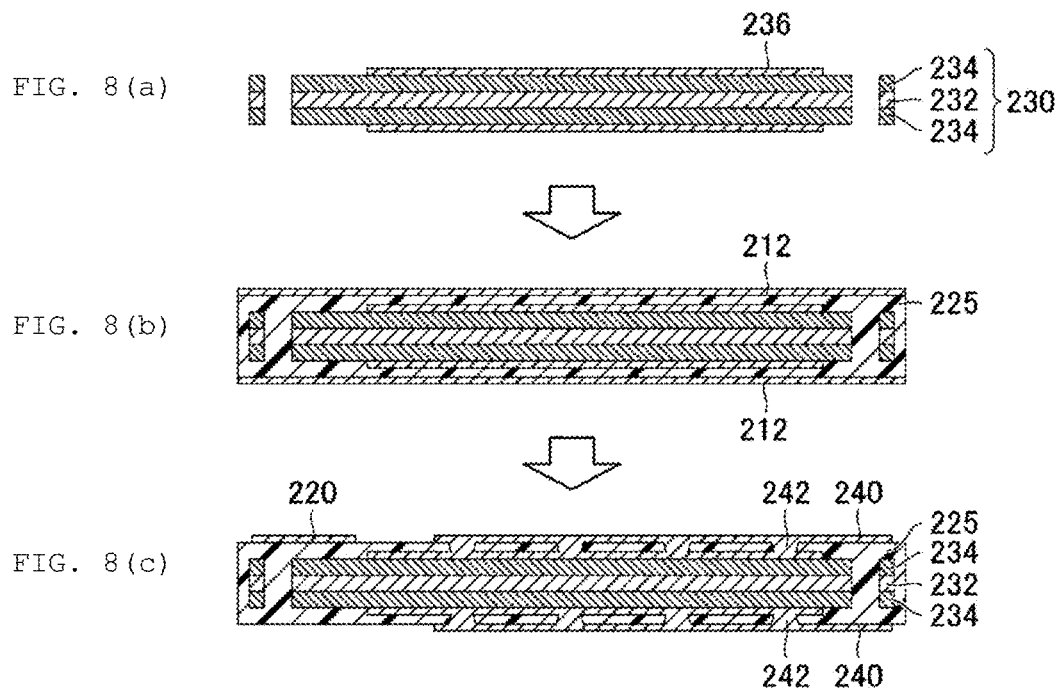
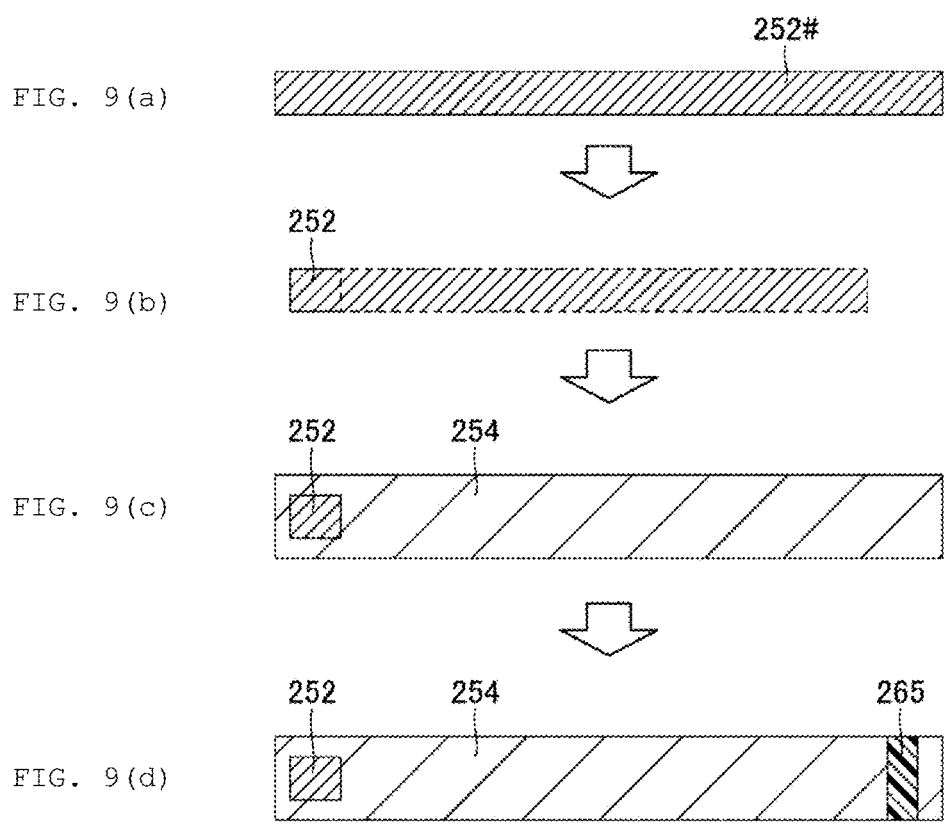

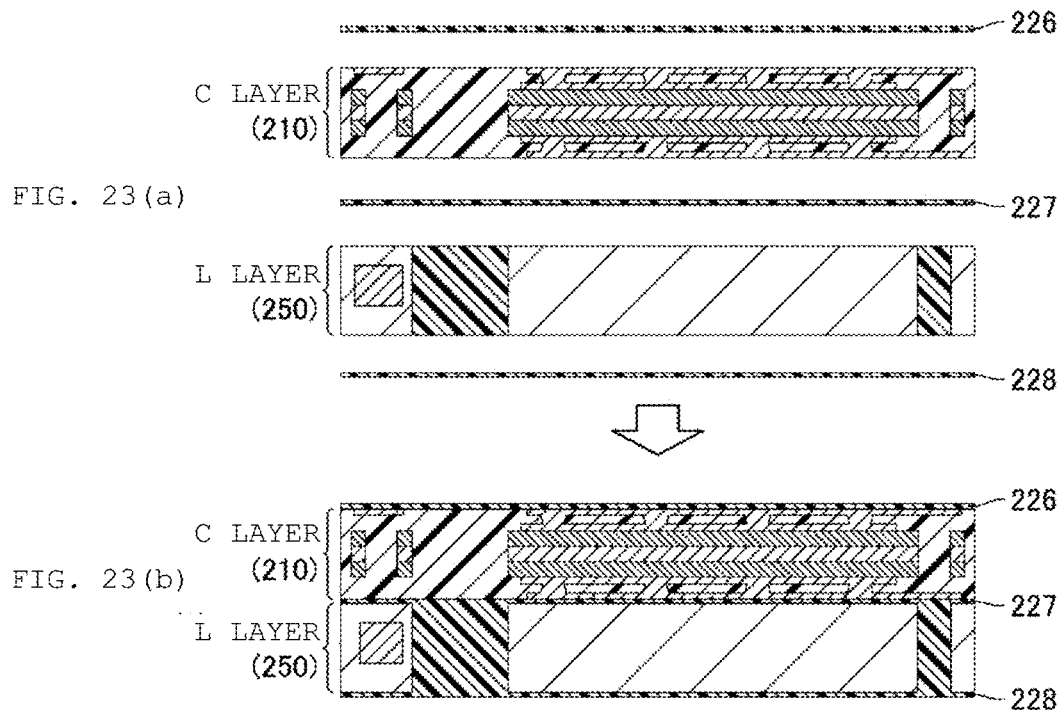
FIG. 23(a)
FIG. 23(b)
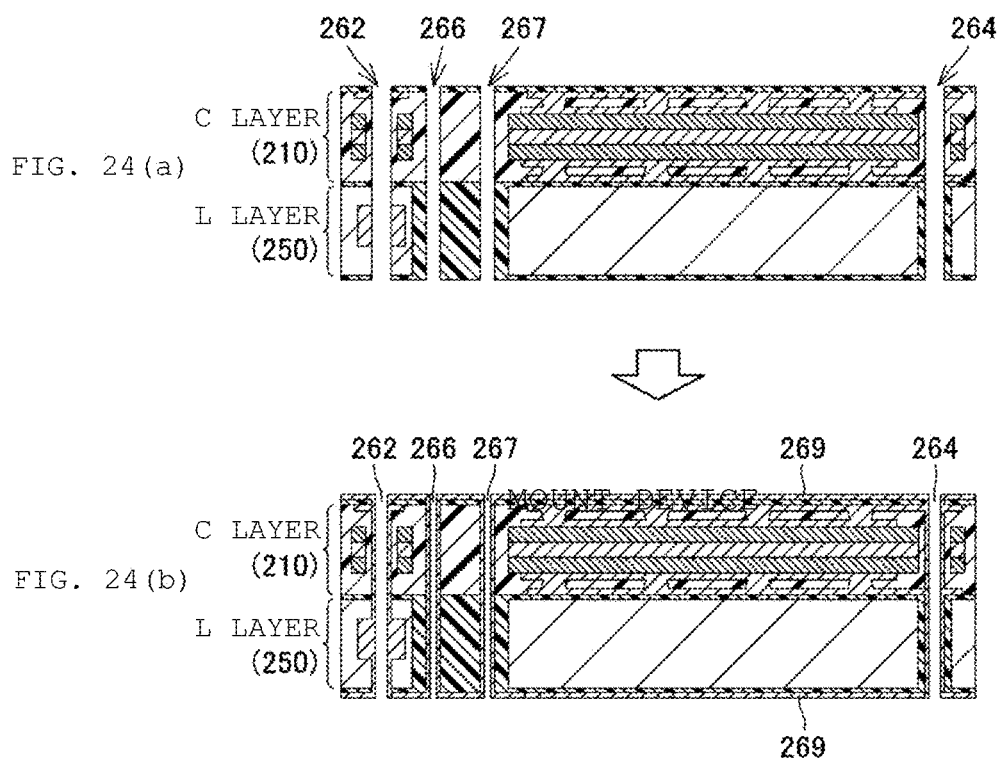
FIG. 24(a)
FIG. 24(b)

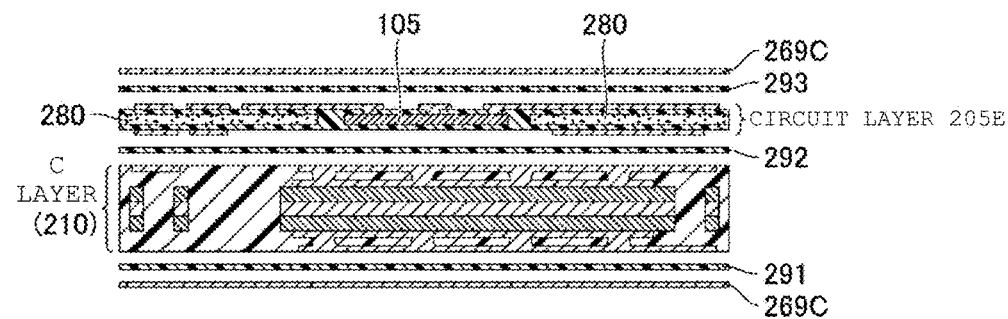
FIG. 33(a)
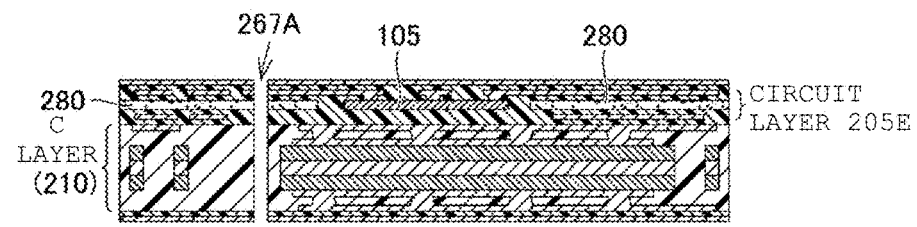
FIG. 33(b)
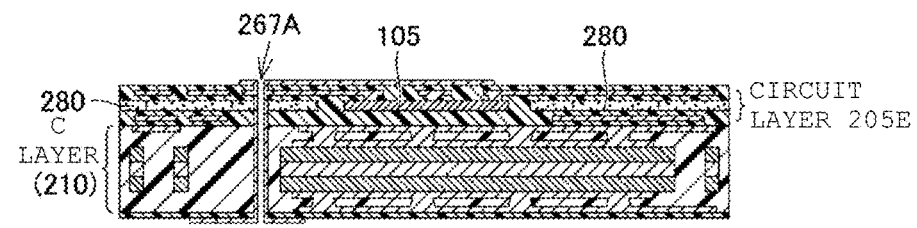
FIG. 33(c)

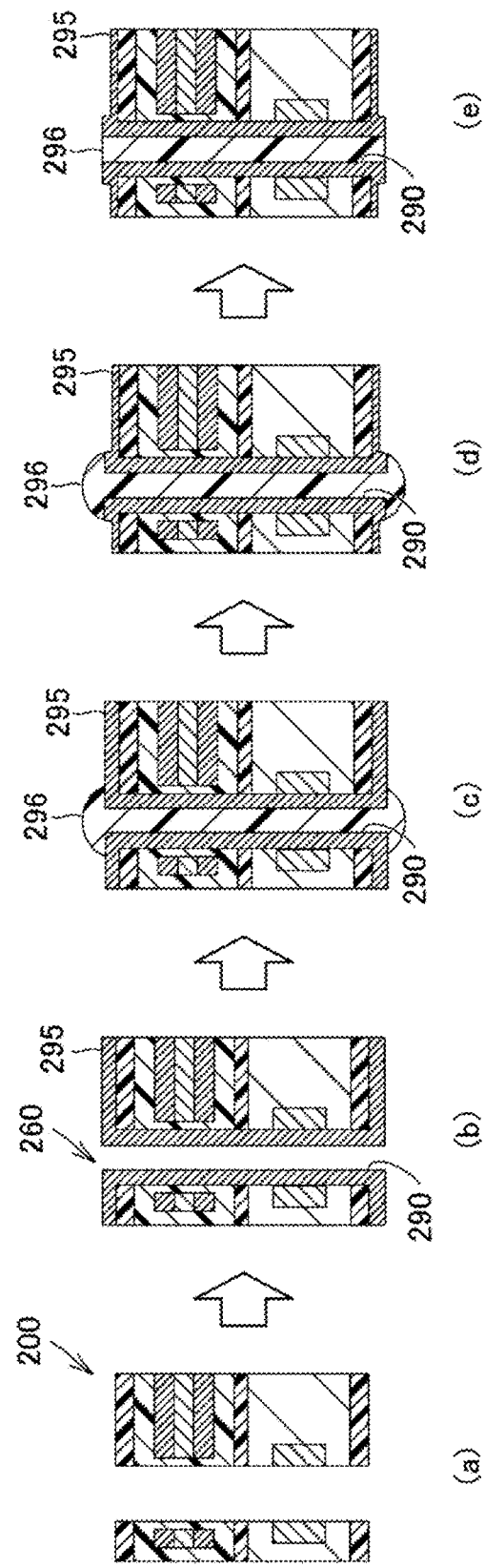

SEMICONDUCTOR COMPOSITE DEVICE AND PACKAGE BOARD USED THEREIN

CROSS REFERENCE TO RELATED APPLICATIONS

The present application is a continuation of U.S. patent application Ser. No. 16/907,557, filed Jun. 22, 2020, which is a continuation of PCT/JP2018/038813 filed Oct. 18, 2018, which claims priority to Japanese Patent Application No. 2017-251203, filed Dec. 27, 2017, Japanese Patent Application No. 2018-029690, filed Feb. 22, 2018, and Japanese Patent Application No. 2018-108409, filed Jun. 6, 2018, the entire contents of each of which are incorporated herein by reference.

TECHNICAL FIELD

The present disclosure relates to a semiconductor composite device and a package board used therein, and more particularly, to a structure of a semiconductor composite device used in a DC voltage converter.

BACKGROUND

U.S. Patent Application Publication No. 2011/0050334 (referred to as "Patent Document 1") discloses a semiconductor device including a package board in which some or all of passive elements, such as inductors or capacitors, are embedded, and a voltage control device (hereinafter, also referred to as a "voltage regulator") including active elements such as switching elements. In the semiconductor device of Patent Document 1, a voltage regulator and a load to be supplied with a power supply voltage are mounted on a package board. The DC voltage adjusted by a voltage adjustment unit is smoothed by a passive element in the package board and supplied to a load.

Semiconductor devices having the above-described voltage regulator are applied to, for example, electronic devices such as a mobile phone and a smartphone. In recent years, size reduction and thinning of electronic devices have been promoted, and accordingly, size reduction of the semiconductor devices themselves has been desired.

In the semiconductor device of Patent Document 1, the inductor and the capacitor are laid out and embedded in the same layer of the package board. In this case, when the area of the mounting face of the package board is reduced to reduce the size of the semiconductor device, the inductance of the inductor and the capacitance of the capacitor formed in the package board cannot be secured sufficiently, and, consequently, desired characteristics cannot be implemented.

SUMMARY OF THE INVENTION

The present disclosure has been made to solve the above problem. Therefore, it is an object of the present invention to reduce the size of a semiconductor composite device while suppressing deterioration in the characteristics of the semiconductor composite device, where the semiconductor composite device includes a package board embedded with an inductor or a capacitor and a voltage regulator.

In an exemplary embodiment, a semiconductor composite device is configured to convert an input DC voltage into a different DC voltage. The semiconductor composite device includes a voltage regulator including a semiconductor active element, a load to which a converted DC voltage is supplied, and a package board having a mounting face on which the load is mounted. The package board includes a first layer in which a capacitor is formed, and a second layer in which an inductor is formed, the second layer being different from the first layer. The package board includes a plurality of through holes penetrating the first layer and the second layer in a direction perpendicular to the mounting face. Moreover, the capacitor is electrically connected to the load through a first through hole among the plurality of through holes. The inductor is electrically connected to the load through a second through hole among the plurality of through holes, and electrically connected to the voltage regulator through a third through hole among the plurality of through holes.

In an exemplary aspect, the first through hole and the second through hole are preferably a common hole. Moreover, the inductor and the capacitor preferably at least partially overlap with each other when the package board is viewed in plan view from the direction perpendicular to the mounting face.

Preferably, the second layer includes metal wiring forming a coil and a composite material surrounding the metal wiring and including a resin and a magnetic material.

Moreover, the capacitor is preferably an electrolytic capacitor. In addition, the voltage regulator, the inductor, and the capacitor preferably form a chopper-type step-down switching regulator.

In an exemplary aspect, the inductor and the capacitor function as an LC filter that smooths the output of the voltage regulator.

In an exemplary aspect, the plurality of through holes further includes at least one fourth through hole that is not connected to any of the inductor and the capacitor. Moreover, the fourth through hole is preferably connected to an external ground line. In addition, the fourth through hole is preferably connected to an external signal line.

Preferably, an inner diameter of the fourth through hole is smaller than inner diameters of the first to third through holes.

In another exemplary aspect, the fourth through hole is connected to an external heat sink. Moreover, the fourth through hole preferably includes a plurality of fourth through holes. The package board further includes a via that is filled with an insulating material, the via being formed to penetrate the first layer and the second layer. The fourth through holes are formed in the via.

Moreover, the fourth through hole is preferably connected to the load immediately below the load. In addition, the mounting face is formed at a first face of the first layer. The second layer is connected to a second face of the first layer, the second face being opposite to the first face.

Preferably, the package board further includes a circuit layer in which a plurality of wiring patterns is formed. The circuit layer is disposed on a first face of the first layer. The second layer is disposed on a second face of the first layer, the second face being opposite to the first face. The mounting face is formed at a face of the circuit layer, the face being remote from the first layer.

In another aspect, the circuit layer preferably includes a core substrate. Moreover, the voltage regulator is formed in the above-mentioned circuit layer.

Preferably, the load overlaps with the voltage regulator in the circuit layer when the package board is viewed in plan view from the direction perpendicular to the mounting face.

In another aspect, the package board further includes a terminal layer in which a plurality of wiring patterns is formed. The terminal layer is disposed on a face of the second layer, the face being remote from the first layer.

Preferably, the voltage regulator is mounted on the mounting face.

A semiconductor composite device according to another aspect is configured to convert an input DC voltage into a different DC voltage to supply a converted DC voltage to a load. The semiconductor composite device includes a voltage regulator including a semiconductor active element, and a package board having a mounting face on which the load is allowed to be mounted. The package board includes a first layer in which a capacitor is formed, a second layer in which the inductor is formed, the second layer being different from the first layer, and a connection terminal disposed on the mounting face and used for electrical connection with the load.

The package board includes a first through hole and a second through hole penetrating the first layer and the second layer in a direction perpendicular to the mounting face. The capacitor is electrically connected to the load through the first through hole. The inductor is electrically connected to the load through the first through hole, and is electrically connected to the voltage regulator through the second through hole.

A semiconductor composite device according to another exemplary aspect receives a DC voltage adjusted by a voltage regulator including a semiconductor active element. The semiconductor composite device includes a load that operates with the DC voltage and a package board having a mounting face on which the load is mounted. The package board includes a first layer in which a capacitor is formed, a second layer in which the inductor is formed, the second layer being different from the first layer, and a connection terminal disposed on the mounting face and used for electrical connection with a voltage regulator. The package board includes a first through hole and a second through hole penetrating the first layer and the second layer in a direction perpendicular to the mounting face. The capacitor is electrically connected to the load through the first through hole. The inductor is electrically connected to the load through the first through hole, and is electrically connected to the voltage regulator through the second through hole.

A package board according to still another exemplary aspect is used in a semiconductor composite device that supplies, to a load, a DC voltage adjusted by a voltage regulator including a semiconductor active element. The package board includes a first layer in which a capacitor is formed, a second layer in which the inductor is formed, the second layer being different from the first layer, and a connection terminal disposed on the mounting face of the package board and used for electrical connection with the voltage regulator and the load. The package board includes a first through hole and a second through hole penetrating the first layer and the second layer in a direction perpendicular to the mounting face. Moreover, the capacitor is electrically connected to the load through the first through hole. The inductor is electrically connected to the load through the first through hole, and is electrically connected to the voltage regulator through the second through hole.

In a semiconductor composite device according to the present disclosure, in a package board, a first layer in which a capacitor is formed and a second layer in which a inductor is formed are laminated as different layers, and a capacitor and/or an inductor, and a voltage regulator or a load are electrically connected through a through hole. As a result, when reducing the size of a semiconductor composite device, capacitance and inductance can be easily secured, compared with the case in which capacitors and inductors are laid out in the same layer. Therefore, the size of a semiconductor composite device can be reduced while suppressing deterioration in the characteristics of the semiconductor composite device.

BRIEF DESCRIPTION OF DRAWINGS

FIGS. 8(a)-(c) are diagrams for describing a formation process (S100) of the C layer.

FIGS. 9(a)-(d) are diagrams for describing a formation process (S110) of the L layer.

FIGS. 23(a)-(b) are first diagrams for describing the details of a manufacturing process of the semiconductor composite device in FIG. 21.

FIGS. 24(a)-(b) are second diagrams for describing the details of the manufacturing process of the semiconductor composite device in FIG. 21.

FIGS. 33(a)-(c) are first diagrams for describing the details of the manufacturing process of the semiconductor composite device in FIG. 31.

FIG. 36 is a diagram for describing a first example of a plating step for a through hole in the semiconductor composite device according to a tenth embodiment.

DETAILED DESCRIPTION

Figure 1:
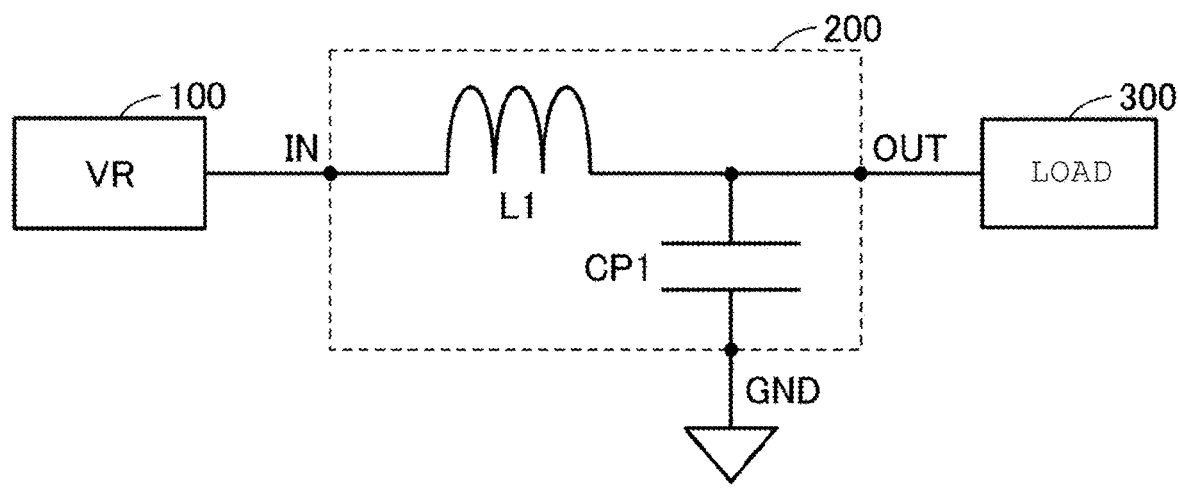
FIG. 1 is a block diagram of a semiconductor composite device according to a first embodiment.

Hereinafter, exemplary embodiments of the present disclosure will be described in detail with reference to the drawings. In the drawings, the same or corresponding portions have the same reference characters allotted, and description thereof will not be repeated.

First Embodiment (Configuration of Device)

FIG. 1 is a block diagram of a semiconductor composite device 10 according to a first embodiment. As shown, the semiconductor composite device 10 includes a voltage control device (voltage regulator ("VR")) 100, a package board 200, and a load 300. Here, the load 300 is, for example, a semiconductor integrated circuit ("IC") such as a logical operation circuit or a storage circuit.

The voltage regulator 100 includes an active element, such as a semiconductor switching element (not shown), and is configured to control the duty of the active element to adjust the DC voltage supplied from the outside to a voltage level suitable for the load 300.

The voltage regulator 100 and the load 300 are mounted on the surface of the package board 200, and the semiconductor composite device 10 is configured as one package component. An inductor L1 and a capacitor CP1 are formed inside the package board 200 as illustrated in detail in FIG. 2 and subsequent figures.

The inductor L1 is connected between an input terminal IN and an output terminal OUT of the package board 200. The inductor L1 is connected to the voltage regulator 100 at the input terminal IN and to the load 300 at the output terminal OUT. The capacitor CP1 is connected between the output terminal OUT and a ground terminal GND. The voltage regulator 100, and the inductor L1 and the capacitor CP1 in the package board 200 form a chopper-type step-down switching regulator. The inductor L1 and the capacitor CP1 function as a ripple filter of the step-down switching regulator. With the switching regulator, for example, a DC voltage of 5 V input from the outside is reduced to 1 V and the reduced DC voltage is supplied to the load 300.

In addition to the voltage regulator 100 and the load 300, electronic devices such as a decoupling capacitor for suppressing noise, a choke inductor, a diode element for surge protection, and a resistance element for voltage division can be mounted on the package board 200.

Figure 2:
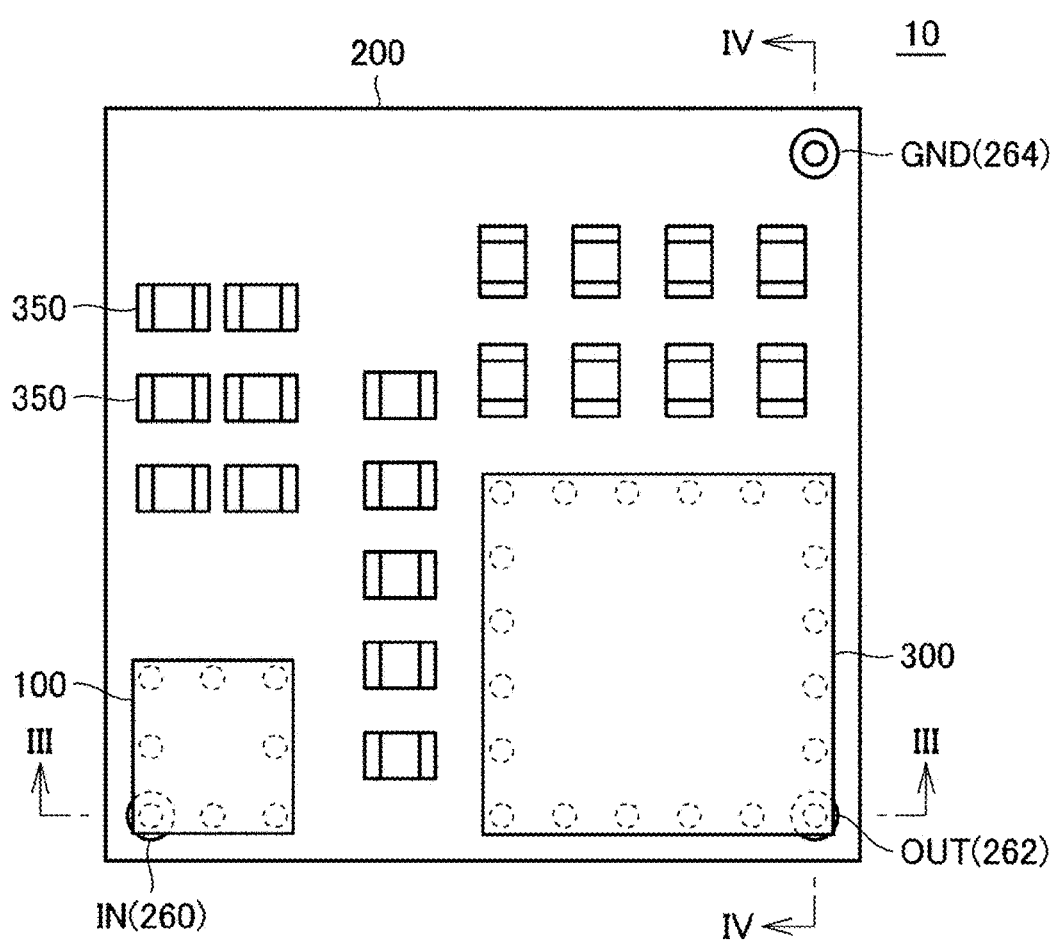
FIG. 2 is a plan view of the semiconductor composite device according to the first embodiment.
Figure 3:
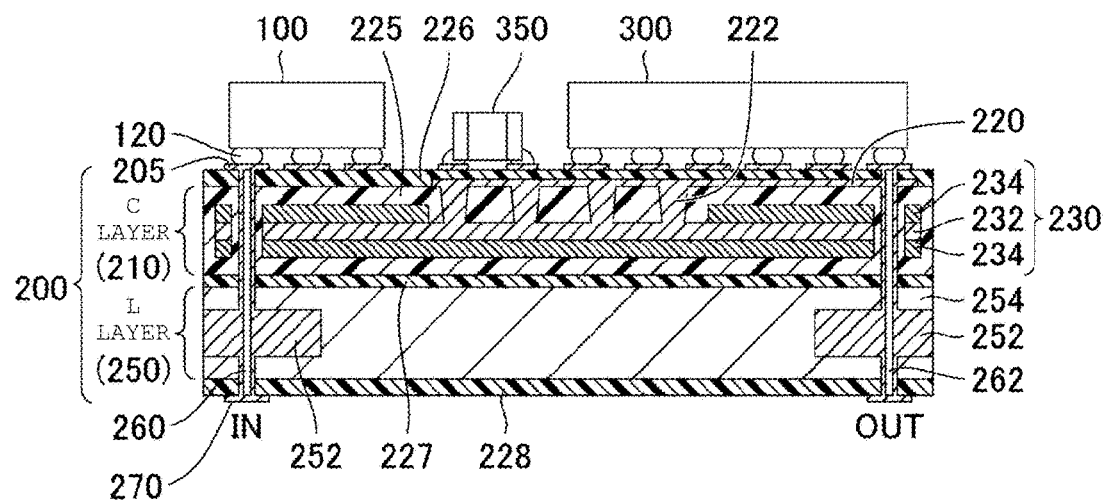
FIG. 3 is a sectional view of the semiconductor composite device in FIG. 2 taken along line III-III.
Figure 4:
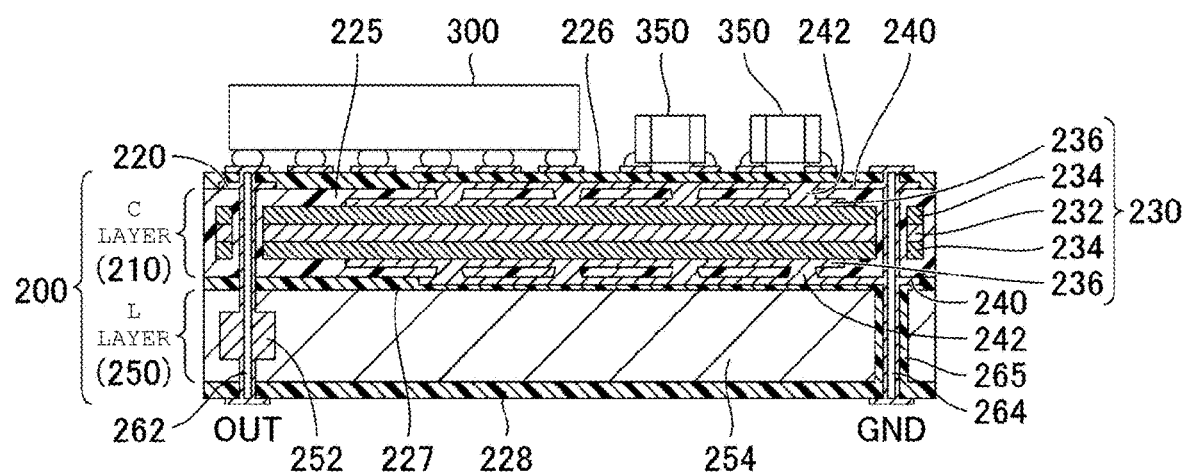
FIG. 4 is a sectional view of the semiconductor composite device in FIG. 2 taken along line IV-IV.
Figure 5:
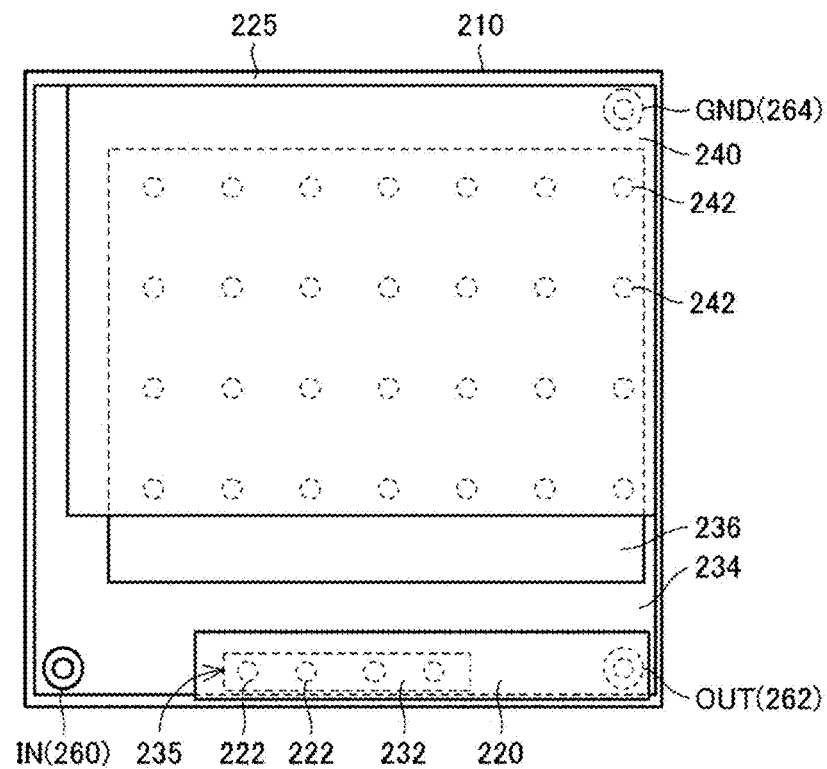
FIG. 5 is a plan view of a portion of a C layer in FIG. 2.
Figure 6:
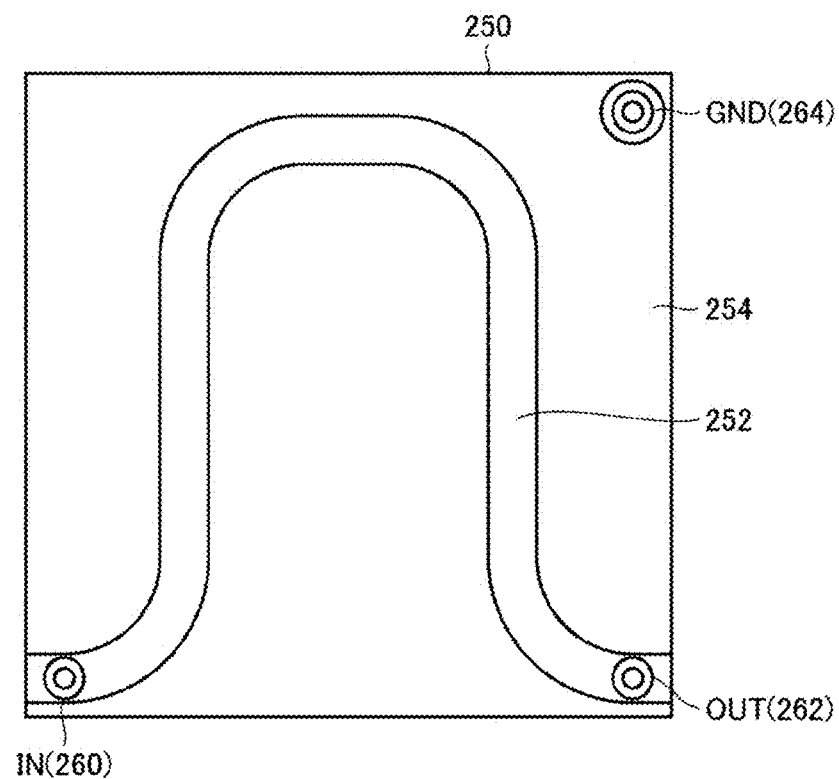
FIG. 6 is a plan view of a portion of an L layer in FIG. 2.

Next, the detailed configuration of the semiconductor composite device 10 will be described with reference to FIGS. 2 to 6. FIG. 2 is a plan view of the semiconductor composite device 10 as viewed from the mounting face of the package board 200. FIG. 3 is a sectional view taken along line in FIG. 2, and FIG. 4 is a sectional view taken along line IV-IV in FIG. 2. FIG. 5 is a plan view of a portion of a C layer 210 forming the capacitor CP1, and FIG. 6 is a plan view of a portion of an L layer 250 forming the inductor L1.

Referring to FIG. 2, a through hole 260 corresponding to the input terminal IN, a through hole 262 corresponding to the output terminal OUT, and a through hole 264 corresponding to the ground terminal GND are formed at the three corners of the mounting face of the package board 200.

In the exemplary aspect, the through holes 260, 262, and 264 penetrate from the front face to the bottom face of the package board 200 in the thickness direction, and the inner face of the penetration holes is metallized with a low-resistance metal such as copper (Cu), gold (Au) or silver (Ag), for example.

For ease of processing, for example, metallization can be performed by electroless Cu plating or electrolytic Cu plating. For the metallization of the through hole, only the inner face of the penetration hole may be metallized, or the penetration hole may be filled with a metal or a composite material of a metal and a resin.

The voltage regulator 100 is disposed at a position overlapping with the through hole 260, and the load 300 is disposed at a position overlapping with the through hole 262. That is, the through holes 260 and 262 are formed at positions immediately below the voltage regulator 100 and the load 300, respectively. Further, as described above, electronic devices 350 other than the voltage regulator 100 and the load 300 are mounted on the mounting face of the package board 200.

Referring to FIGS. 3 to 6, the package board 200 is configured to include the C layer 210 forming the capacitor CP1, the L layer 250 forming the inductor L1, and resin layers 226, 227, and 228.

The resin layers 226, 227, and 228 are used as a bonding material for bonding respective layers, and are used as an insulation layer for insulating the exposed faces of the C layer 210 and the L layer 250. The C layer 210 and the L layer 250 are joined through the resin layer 227. The resin layer 226 is formed on the front face of the C layer 210, and the resin layer 228 is formed on the bottom face of the L layer 250. The resin layers 226, 227, and 228 are formed of an insulating material such as epoxy or a composite material of epoxy and an inorganic filler such as silica, for example. In order to secure the adhesion of the metallizing layer of the through hole, it is preferable to use a material mainly composed of epoxy as the resin layer. Alternatively, a prepreg containing a fibrous reinforcing material such as glass cloth or carbon fiber may be used as the resin layers 226, 227, and 228. In particular, by using a prepreg with a small coefficient of linear expansion such as glass cloth, it is possible to suppress warpage of the C layer 210 and the L layer 250, so that the warpage of the entire package board 200 can be suppressed.

A circuit layer 205 including lands for mounting devices such as the voltage regulator 100 and wiring for connecting the lands is formed on the surface of the resin layer 226. The devices mounted on the package board 200 are electrically connected to lands or terminals of the circuit layer 205 through a solder bump 120.

The circuit layer 205 is formed of a low-resistance metal material such as Cu, Au, or Ag, for example. It is noted that the circuit layer 205 is not limited to being formed only on the surface of the resin layer 226, and for example, may be formed in layers inside the resin layer 226 as described later. In addition, in order to facilitate mounting of the device, a surface treatment such as nickel/gold (Ni/Au) plating, nickel/lead/gold (Ni/Pb/Au) plating, or pre-flux treatment is applied to the surface of the land or the terminal formed on the mounting face of the circuit layer 205. Further, a solder resist layer may be formed on the outermost layer portion of the circuit layer 205 in order to prevent solder flow at the time of surface mounting of the device.

The C layer 210 includes a capacitor portion 230 forming the capacitor CP1, a conductive portion 220 electrically connected to the through hole 262 of the output terminal OUT, a conductive portion 240 electrically connected to the through hole 264 of the ground terminal GND, and an insulating portion 225 provided around them. The capacitor portion 230 includes an anode electrode 232 composed of a core material of a valve metal base, a porous layer 234 disposed on at least one main face of the core material and having a dielectric layer and a solid electrolyte layer on the surface, and a cathode electrode 236 provided on the solid electrolyte layer, forming an electrolytic capacitor. The dielectric layer is formed on the surface of the porous layer of the valve metal base. The dielectric layer formed on the surface of the porous layer is porous reflecting the surface state of the porous layer, and has a fine uneven surface shape. The dielectric layer is preferably made of an oxide film of the valve metal, for example. In the electrolytic capacitor of the exemplary embodiment, examples of the solid electrolyte material forming the solid electrolyte layer include conductive polymers such as polypyrroles, polythiophenes, and polyanilines. Among these conductive polymers, polythiophenes are preferable, and poly (3,4-ethylene-dioxythiophene) called PEDOT is particularly preferable. Further, the conductive polymer may contain a dopant such as polystyrene sulfonic acid ("PSS"). The solid electrolyte layer preferably includes an inner layer that fills pores (i.e., recesses) of the dielectric layer and an outer layer that covers the dielectric layer.

The conductive portions 220 and 240 are mainly made of a low-resistance metal such as Ag, Au, or Cu. For the purpose of improving the adhesion between the layers, a conductive adhesive material obtained by mixing the conductive filler and the resin may be provided as the conductor. The porous layer 234 is made of, for example, aluminum oxide (AlO2) or tantalum oxide (Ta2O5). The porous layer 234 is formed by covering the surface of a porous substrate metal (for example, Al, Ta) serving as the anode electrode 232 with an oxide film. The cathode electrode 236 is, for example, formed of a low-resistance metal such as Ag, Au, or Cu.

The insulating portion 225 is made of a resin, such as epoxy, phenol, or polyimide, or the resin and an inorganic filler such as silica or alumina.

Moreover, the anode electrode 232 has a flat plate shape, and is disposed between two flat porous layers 234. The cathode electrode 236 is formed on the face of each porous layer 234, where the face is remote from the anode electrode 232.

As illustrated in FIGS. 2 and 5, the porous layer 234 on the side of the mounting face of the device is partially cut away, so that the anode electrode 232 is exposed, and in the cutout portion 235, the anode electrode 232 is electrically connected to the conductive portion 220 through a via 222. Further, the cathode electrode 236 is electrically connected to the conductive portion 240 through a via 242.

In addition, as the capacitor portion 230, it is also possible to use a ceramic capacitor including barium titanate, or a thin-film capacitor including silicon nitride (SiN), silicon dioxide (SiO2), hydrogen fluoride (HF), or the like. However, from the viewpoint of the ability to form a capacitor portion with a thinner and relatively large area, and with mechanical properties such as the rigidity and flexibility of the package board, it is preferable to use an electrolytic capacitor with a substrate of a metal, such as aluminum, or example.

In the capacitor portion 230, penetration holes are formed in the portions where the through holes 260, 262, and 264 are formed, and a space between the penetration hole and the through hole is filled with the insulating material of the insulating portion 225.

In the first exemplary embodiment, the thickness of each of the anode electrode 232 and the porous layer 234 is approximately 50 μm, the thickness of the conductive portions 220 and 240 is approximately 15 μm, the thickness of the insulating portion 225 above and below the capacitor portion 230, and the thickness of the entire C layer 210 is approximately 200 μm.

As illustrated in FIG. 6, the L layer 250 includes a coil portion 252 forming the inductor L1, and an insulating portion 254 in which the periphery of the coil portion 252 is molded with resin.

The coil portion 252 is metal wiring formed by patterning a Cu core material (Cu foil) formed to have a thickness of about 100 μm by electroforming or rolling into a coil shape using a photoresist or the like, and then etching the Cu core material. One end of the coil portion 252 is electrically connected to the through hole 260, and the other end is electrically connected to the through hole 262.

It is noted that aluminum (Al) may be used as the core material of the coil portion 252. Moreover, in particular, in a case where the capacitor portion 230 is formed of an electrolytic capacitor having aluminum as a substrate, when the core material of the coil portion 252 is formed of copper, the entire package board 200 may become warped due to the difference in coefficient of linear expansion between aluminum and copper. Therefore, in such a case, the warpage of the entire board can be suppressed by reducing the difference in coefficient of linear expansion by using aluminum as the core material of the coil portion 252.

The insulating portion 254 is formed of, for example, a resin such as epoxy, phenol, or polyimide, or a mixed material of the resin and an inorganic magnetic filler such as ferrite or silicon steel. In the case of a circuit for supplying DC power to the load 300 as in the first embodiment, it is preferable to use a filler made of a metal-based magnetic material such as silicon steel having excellent DC superimposing characteristics.

The inorganic magnetic filler may be configured such that fillers with different average grain diameters are dispersed in order to improve the magnetic properties, and the dispersion concentration has a gradient in order to prevent magnetic saturation. In addition, a flat or scale-like filler may be used in order to give directionality to the magnetic characteristics. When using a metal-based material such as silicon steel as the inorganic magnetic filler, a surface insulating film may be formed around the filler with an inorganic insulating film, an organic insulating film, or the like to increase insulation.

It is noted that an inorganic filler other than the magnetic material, and an organic filler may be mixed for the purpose of reducing the difference in coefficient of linear expansion from the coil portion 252 and improving the heat dissipation and insulation.

By adjusting the thickness of the insulating portion 254, the inductance can be adjusted. In the example of the first embodiment, each of the insulating portions 254 above and below the coil portion 252 with the thickness of 100 μm has a thickness of 100 μm, and the thickness of the entire L layer 250 is approximately 300 μm.

A terminal layer 270 for mounting the semiconductor composite device 10 on a mother board (not shown) is formed on the surface of the resin layer 228 provided on the bottom face of the L layer 250. The terminal layer 270 includes the input terminal IN, the output terminal OUT, and the ground terminal GND described above. Further, as in the circuit layer 205 formed on the C layer 210, the terminal layer 270 may include, in addition to the terminal, wiring forming a circuit, and can be formed of layers.

The package board 200 is generally required to have a thickness of 2 mm or less from the viewpoints of reducing in the thickness of the system and heat dissipation of the load 300. In the example of the first embodiment, an upper circuit layer including the resin layer 226 and the circuit layer 205 has a thickness of 50 μm, the C layer 210 has a thickness of 200 μm, the resin layer 227 has a thickness of 20 μm, the L layer has a thickness of 300 μm, and a bottom terminal layer including the resin layer 228 and the terminal layer 270 has a thickness of 50 μm, and the thickness of the entire semiconductor composite device 10 is about 0.6 mm.

In the semiconductor composite device 10 having the above configuration, since the inductor L1 and the capacitor CP1 forming the ripple filter are formed in different layers of the package board 200, the area available for forming the inductor and the capacitor can be increased, compared to a conventional configuration where the inductor and capacitor are formed in the same layer. This makes it easier to provide inductance and capacitance when the device is reduced in size. Also, as illustrated in FIGS. 5 and 6, when the package board 200 is viewed in plan view from a plane perpendicular to the mounting face of the package board 200, the capacitor portion 230 in the C layer 210 and the coil portion 252 in the L layer 250 are disposed so as to at least partially overlap with each other in different layers. Therefore, the size of the device can be further reduced.

In the configuration of the first embodiment, the connection between the voltage regulator 100 and the load 300, and the inductor L1 and the capacitor CP1 in the package board 200, and the connection between the inductor L1 and the capacitor CP1 are made using the through holes 260, 262, and 264 penetrating the package board 200 without using planar wiring on the board. As a result, the connection distance can be shortened, so that the impedance of the wiring can be reduced, and the power loss can be reduced. Further, the circuit face layout on the board can be minimized. Therefore, restriction on size reduction of the device can be further reduced.

Further, by molding the coil portion 252 with the insulating portion 254 containing a magnetic material in the L layer 250 where the inductor L1 is formed, the Q value of the inductor L1 can be improved by increasing the generated magnetic flux density. Thereby, the loss due to the inductor L1 can be reduced. Also, use of the magnetic material makes it possible to reduce the magnetic coupling between the inductor L1 and the capacitor CP1, and between the inductor L1 and the active element of the voltage regulator 100, and, consequently noise propagation due to magnetic coupling can be suppressed. Therefore, the device characteristics can be further improved.

In the above description, the C layer is disposed above the L layer in the package board. However, it is noted that the order in which the L layer and the C layer are disposed may be reversed as long as electrical connection is maintained.

Also, in the above, although an example in which the features of the first embodiment are applied to the chopper-type step-down switching regulator has been described, the features of the first embodiment can be applied to a semiconductor composite device in which a power transmission line including a step-up/step-down circuit is systematized.

(Manufacturing Process of Device)

Figure 7:
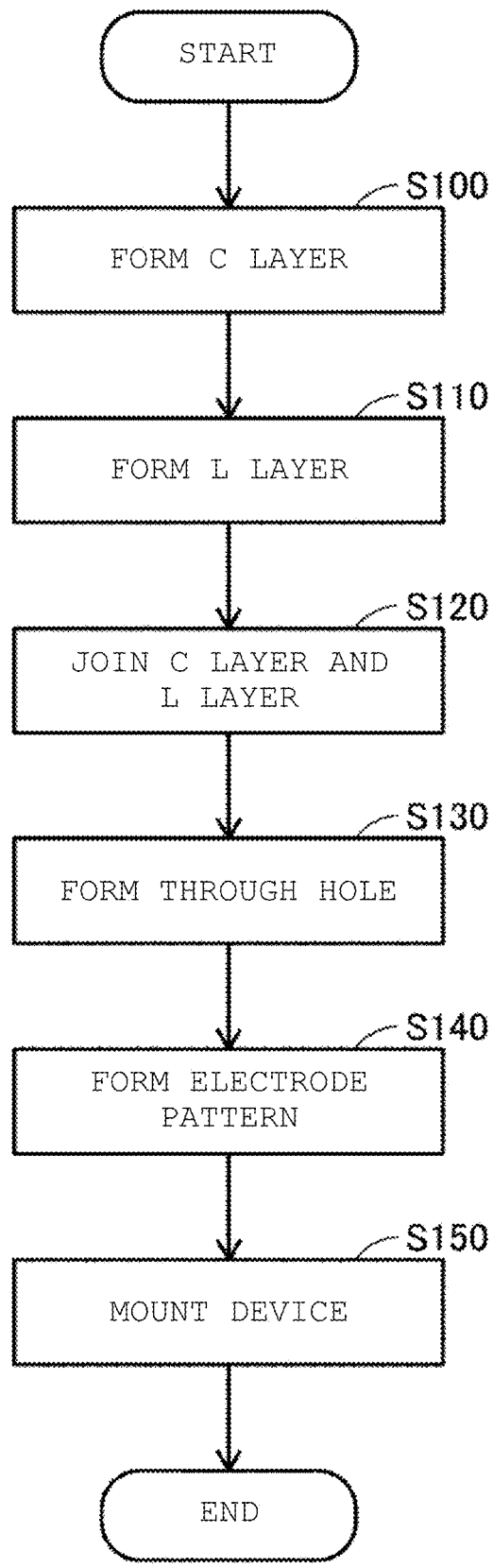
FIG. 7 is a flowchart illustrating a manufacturing process of the semiconductor composite device.

Next, a manufacturing process of the semiconductor composite device 10 according to the first embodiment will be described with reference to FIGS. 7 to 12. FIG. 7 is a flowchart for describing the outline of the manufacturing process, and FIGS. 8 to 12 are diagrams for describing the details of each step of the flowchart in FIG. 7.

Referring to FIG. 7, in S100 and S110, the C layer 210 and the L layer 250 are individually formed. Thereafter, in S120, the formed C layer 210 and the formed L layer 250 are joined and integrated by using the resin layers 226, 227, and 228. Next, in S130, the through hole is formed in the integrated C layer 210 and L layer 250. Then, electrode patterns and wiring patterns are formed on the mounting face (S140), and devices such as the voltage regulator 100 are mounted on the completed package board 200 (S150).

FIGS. 8(a)-(c) are diagrams for describing the formation process of the C layer 210 in S100. Referring to FIG. 8(a), first, both faces of aluminum serving as the anode electrode 232 are processed into a porous shape, and an oxide film is applied to the surfaces to form the porous layers 234. Thereafter, the cathode electrode 236 is formed by forming a cured film of a conductive paste such as a Cu paste on the surface of the porous layer 234.

At this time, as in the C layer 210 in FIG. 3, part of the porous layer 234 is cut out until the aluminum of the anode electrode 232 is exposed, for example, by a dicing process and Cu paste is baked on the exposed aluminum. Thus, the capacitor portion 230 is formed.

Thereafter, a penetration hole is formed in a portion where the through hole is to be formed by drilling, laser processing, or the like.

Next, as illustrated in FIG. 8(b) a resin such as epoxy, polyimide, or phenol, or the mixed material of the resin and the inorganic filler is laminated on the capacitor portion 230, and further, by heat curing, the capacitor portion 230 is sealed to form the insulating portion 225. After the sealing process, a conductive layer 212 for forming the conductive portions 220 and 240 for connecting the through holes and the respective electrodes of the capacitor portion 230 is formed on the surface of the insulating portion 225 by plating wiring processing or the like.

After that, the conductive portions 220 and 240 are formed by processing the conductive layer 212 by etching or the like. A hole reaching the anode electrode 232 and the cathode electrode 236 is opened by performing laser processing or the like on the conductive portions 220 and 240. The opening is filled with a conductor such as Cu, so that the conductive portion 220 and the anode electrode 232 are electrically connected, and the conductive portion 240 and the cathode electrode 236 are electrically connected (FIG. 8(c)). Thereby, the C layer 210 is formed.

FIGS. 9(a)-(c) are diagrams for describing the formation process of the L layer 250 in S110. Referring to FIG. 9(a), first, patterning is performed on both faces of the Cu foil 252# serving as the core with a photoresist or the like, and the photoresist opening is etched to form the coil portion 252 (FIG. 9(b)).

Thereafter, an epoxy composite sheet in which a metal magnetic fillers such as ferrite or silicon steel is dispersed is laminated on the surface of the coil portion 252 using a vacuum laminator or the like, and flattening and heat curing of the epoxy layer is performed by a hot press machine to form the insulating portion 254 (FIG. 9(c)).

Then, a penetration hole is formed in a portion where the through hole is to be formed by drilling or laser processing, and the penetration hole is filled with an insulating resin 265 (FIG. 9(d)). Thus, the L layer 250 is formed.

Figure 10A:
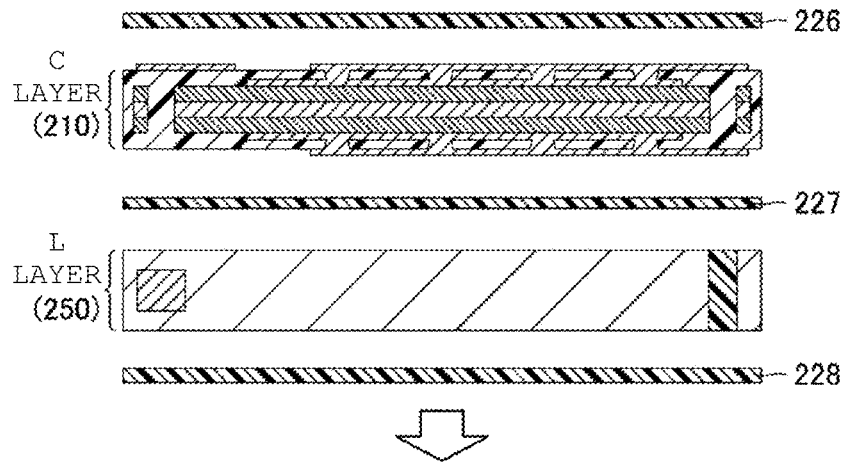
FIGS. 10(a)-(b) are diagrams for describing a bonding process (S120) between the C layer and the L layer.
Figure 10B:
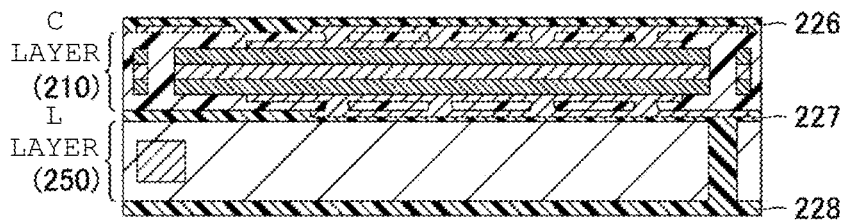

FIGS. 10(a)-(b) are diagrams for describing the bonding process for the C layer 210 and the L layer 250 in S120.

Referring to FIG. 10(a), the resin layers 226, 227, and 228 in the form of a film of a resin such as epoxy, polyimide or phenol, or a mixed material composed of the resin and an inorganic filler are disposed on the upper face of the C layer 210 formed in S100, the lower face of the L layer 250 formed in S110, and the intermediate faces of the C layer 210 and the L layer 250. After that, these laminated layers are integrated by bonding and curing by a vacuum press or the like to form the package board 200 (FIG. 10(b)).

Figure 11A:
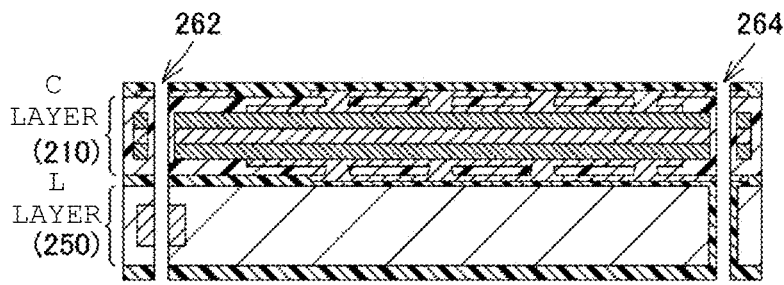
FIGS. 11(a)-(b) are diagrams for describing a formation process (S130) of a through hole.
Figure 11B:
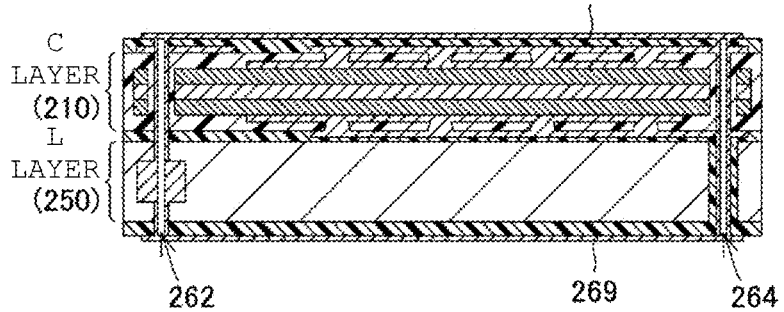

FIGS. 11(a)-(b) are diagrams for describing a formation process of a through hole in S130.

Referring to FIG. 11(a), after forming the package board 200 by integrating the respective layers, a penetration hole is formed in a portion where the through hole is to be formed by drilling or laser processing. Then, the inside of the penetration hole and the surfaces of the resin layers 226 and 228 are metallized by electroless Cu plating or the like (FIG. 11(b)).

At this time, by further performing electrolytic Cu plating process, the thickness of a metal layer 269 on the surface of the resin layer may be increased, or the inside of the through hole may be filled with Cu.

Figure 12A:
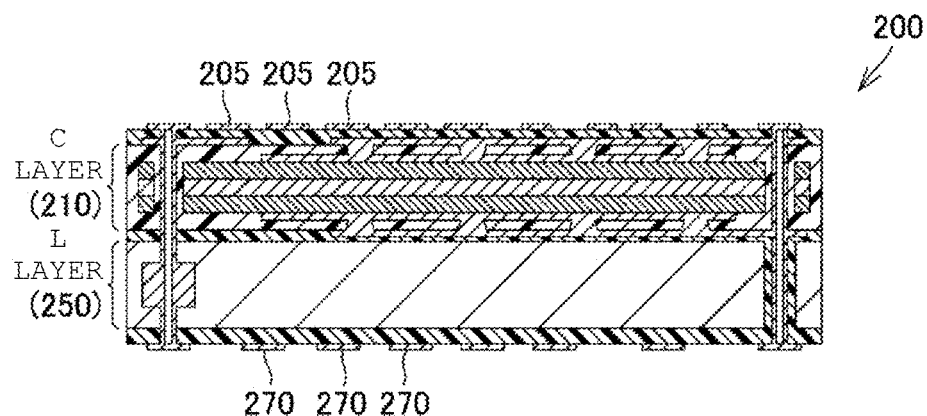
FIGS. 12(a)-(b) are diagrams for describing a formation process (S140) of an electrode pattern and a device mounting process (S150).
Figure 12B:
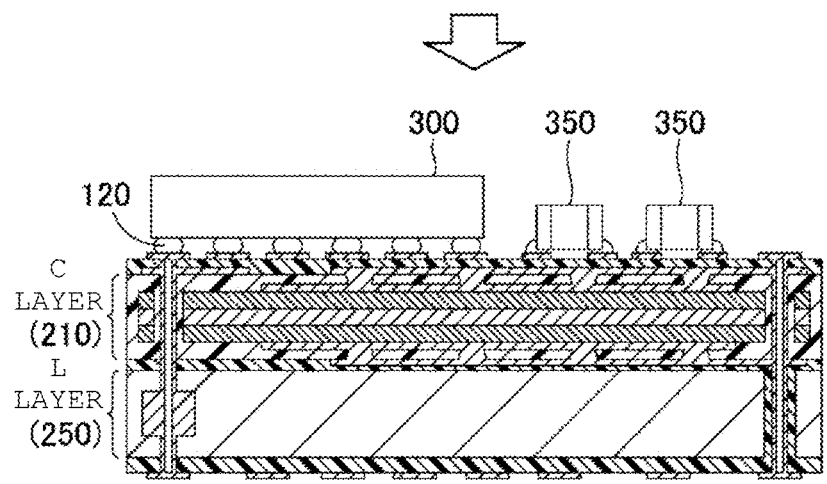

FIGS. 12(a)-(b) are diagrams for describing a process corresponding to S140 and S150. Referring to FIG. 12(a), in S140, by patterning the metal layer 269 on the resin layer surface using a photoresist, performing etching and removing unnecessary Cu, wiring, lands, and terminals forming the circuit layer 205 and the terminal layer 270 are formed on the surface of the resin layer. At this time, to facilitate the mounting of the device, surface treatment such as Ni/Au plating, Ni/Pb/Au plating, or pre-flux treatment is performed on metal surfaces of the lands, the terminals, and the like. Further, a solder resist layer may be formed on the outermost layer portion in order to prevent solder flow at the time of surface mounting of the device.

In the package board 200 thus formed, the voltage regulator 100, the load 300, and other electronic devices 350 are mounted on the circuit layer 205 on the surface of the C layer 210 to form the semiconductor composite device 10 according to the first embodiment (FIG. 12(b)).

In the present embodiment, the "C layer 210" and the "L layer 250" are examples of a "first layer" and a "second layer" in the present disclosure.

Second Embodiment

In a second embodiment, in addition to the configuration of the package board 200 described in the first embodiment, a configuration in which a signal ground line of a device mounted on a mounting face is formed by a through hole will be described.

Figure 13:
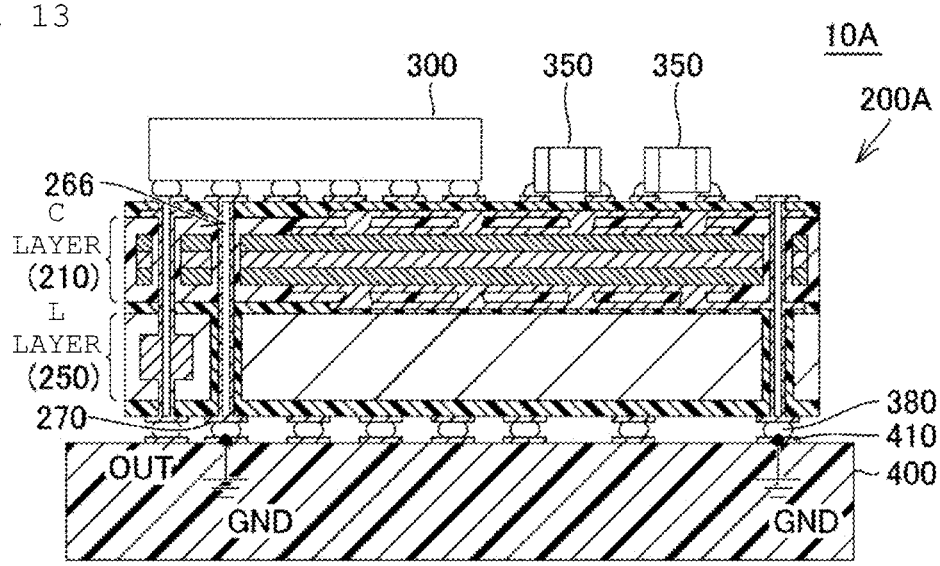
FIG. 13 is a sectional view of a semiconductor composite device according to a second embodiment.

FIG. 13 is a sectional view of a semiconductor composite device 10A according to the second embodiment. FIG. 13 is a diagram corresponding to FIG. 4 of the first embodiment, and illustrates a state in which the semiconductor composite device 10A is mounted on a mother board 400 as shown.

Referring to FIG. 13, a package board 200A included in the semiconductor composite device 10A includes a through hole 266 connected to the terminal of the signal ground line of the load 300 when the load 300 is mounted on the board. This through hole 266 penetrates to the terminal layer 270 at the bottom face in a state where it is not electrically connected to the capacitor portion 230 and the coil portion 252 respectively included in the C layer 210 and the L layer 250. Then, they are electrically connected through a solder bump 380 to terminals 410 connected to the ground lines of the mother board 400.

In this way, by connecting the ground line of the mounted device to the ground line of the mother board 400 at the shortest distance through the through hole 266, the ground can be strengthened, and immunity to noise can be improved. Further, since through holes are used, the layout on the board can be minimized, and the influence on size reduction can be reduced.

It is noted that although FIG. 13 describes the through hole of the ground line of the load 300, the same configuration may be applied to the ground lines of other mount devices.

Third Embodiment

In the second embodiment, although the configuration for connecting, by using a through hole, the signal ground line of the mounted device to the ground line of the mother board 400 has been described, when a signal line between the device and the mother board 400 is needed, the signal line may also be connected by using a through hole.

Figure 14:
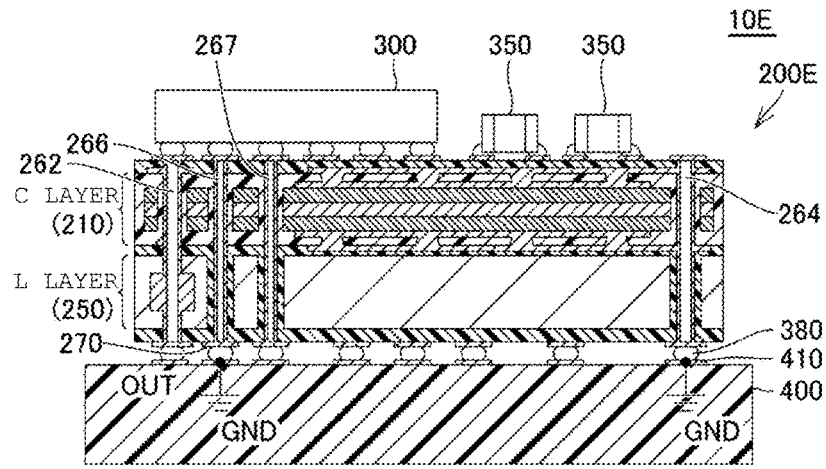
FIG. 14 is a sectional view of a semiconductor composite device according to a third embodiment.

FIG. 14 is a sectional view of a semiconductor composite device 10E according to the fourth embodiment. Referring to FIG. 14, a package board 200E included in the semiconductor composite device 10E includes a through hole 267 serving as a terminal of a signal line of the load 300 or the voltage regulator 100 disposed on the mounting face. As in the through hole 266 for a signal ground line in the second embodiment, the through hole 267 penetrates to the terminal layer 270 at the bottom face in a state where it is not electrically connected to the capacitor portion 230 and the coil portion 252 respectively included in the C layer 210 and the L layer 250. The through hole 267 is electrically connected, through the solder bump 380 and the terminal 410, to a signal line for connecting to an I/O terminal of a device (not shown) formed on the mounting face of the mother board 400.

Since the current flowing through the through hole 267 is smaller than the current flowing through the power through holes 260, 262, and 264 connected to the capacitor portion 230 and the coil portion 252, the inner diameter of the through hole 267 can be made smaller than those of the through holes 260, 262, and 264.

In this way, when a signal line for exchanging signals between the mounted device and the mother board 400 is required, it is possible to connect the mounted device to the mother board 400 at the shortest distance by connecting them through the through hole 267. Also, by making the signal through hole smaller than the power through hole, the layout on the board can be minimized, and the effect on size reduction can be reduced.

In FIG. 14, in addition to the through hole 267 for the signal line, the through hole 266 for the ground line described in the second embodiment is also described, but a configuration in which the through hole 266 is not provided and only the signal line through hole 267 is provided may be employed.

Fourth Embodiment

In a fourth embodiment, in addition to the configuration of the package board 200 described in the first embodiment, a configuration having a through hole connected to an external heat sink in order to enhance the heat dissipation of each device mounted on the mounting face will be described.

Figure 15:
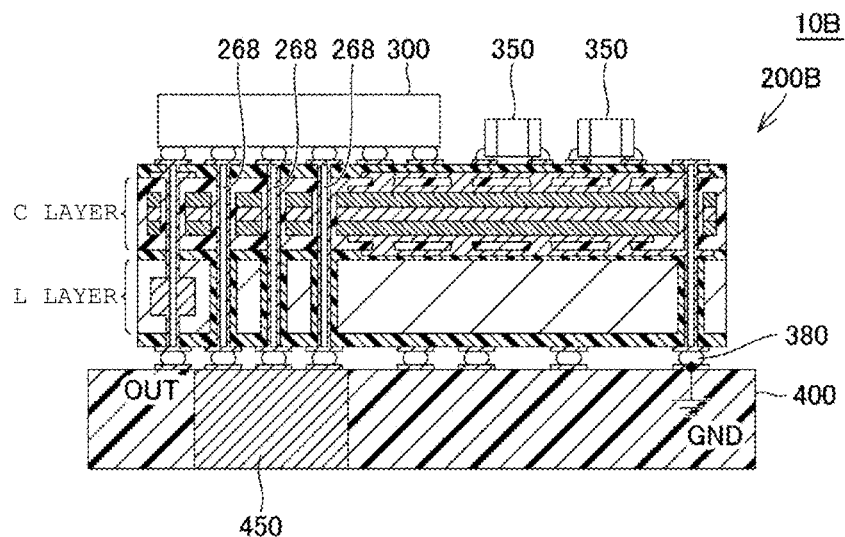
FIG. 15 is a sectional view of a semiconductor composite device according to a fourth embodiment.

FIG. 15 is a sectional view of a semiconductor composite device 10B according to the fourth embodiment. FIG. 15 is a diagram corresponding to FIG. 4 of the first embodiment, and illustrates a state in which the semiconductor composite device 10B is mounted on the mother board 400.

Referring to FIG. 15, a package board 200B includes at least one through hole 268 that is connected to the terminal of the load 300, and is not electrically connected to the capacitor portion 230 and the coil portion 252 respectively included in the C layer 210 and the L layer 250. The through hole 268 is connected to a terminal of the load 300 immediately below the load 300. Further, the through hole 268 is connected to a heat sink 450 provided on the mother board 400 through the solder bump 380 on the bottom face of the package board 200B.

The heat sink 450 is formed of a metal having a high thermal conductivity, such as Al or Cu. In this way, by connecting the mount device such as the load 300 and the heat sink 450 through the through hole 268, the heat generated by the load 300 can be efficiently released to the outside. The through holes 268 can also dissipate heat generated by the inductor and the like in the package board 200B.

It is also noted that a through hole 268 for connecting to the heat sink 450 can be provided for a mount device other than the load 300. Further, the number of through holes 268 is not limited to the number illustrated in FIG. 15, and the number may be determined according to the heat dissipation capability required for the mount device to be connected.

Fifth Embodiment

In the examples of the first to fourth embodiments, the configuration in which the package board includes one C layer and one L layer has been described.

However, the area of the mounting face may be limited due to size restrictions of the semiconductor composite device. In such a case, in particular, a sufficient area of the electrode in the C layer cannot be ensured, and a desired capacitance may not be obtained.

Therefore, in a fifth embodiment, a configuration will be described in which C layers are provided in a package board to secure a desired capacitance.

Figure 16:
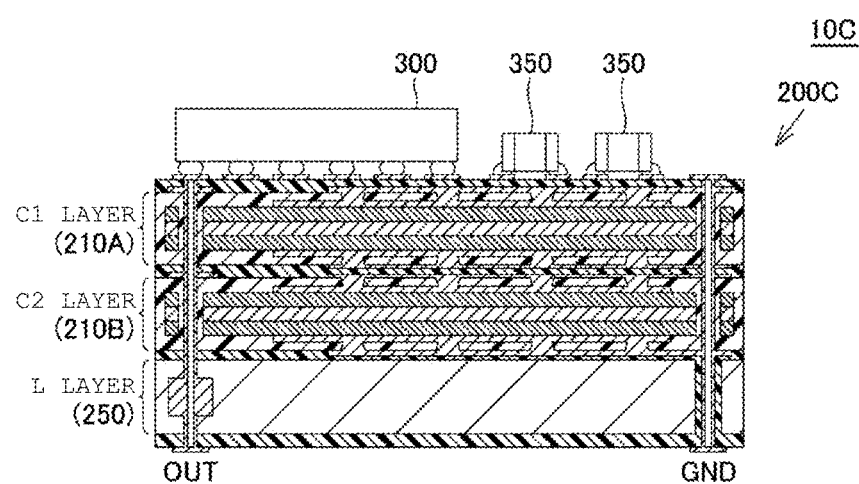
FIG. 16 is a sectional view of a first example of a semiconductor composite device according to a fifth embodiment.

FIG. 16 is a sectional view of a semiconductor composite device 10C according to the fifth embodiment. FIG. 16 is a diagram corresponding to FIG. 4 of the first embodiment. In a package board 200C of FIG. 16, two layers, a C1 layer 210A and a C2 layer 210B, are provided as layers forming the capacitor CP1. Since the configuration of the C1 layer 210A and the C2 layer 210B is basically the same as that of the C layer 210 of the first embodiment, details will not be repeated, but the C1 layer 210A and the C2 layer 210B share the same through hole, and are electrically connected in parallel between the output terminal OUT and the ground terminal GND. As a result, although the semiconductor composite device 10C is slightly higher in the height direction of the semiconductor composite device 10C, the capacitance of the capacitor CP1 can be increased without changing the mounting area of the package board.

Figure 17:
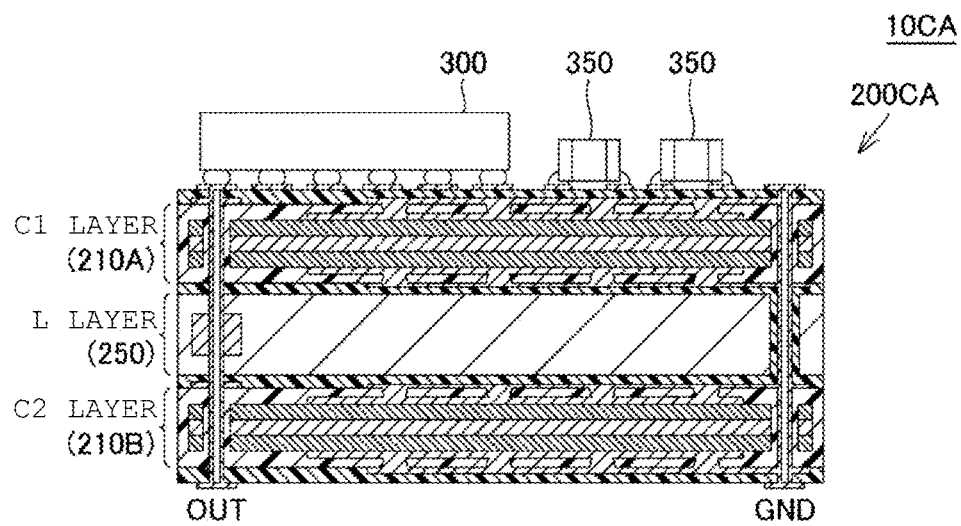
FIG. 17 is a sectional view of a second example of the semiconductor composite device according to the fifth embodiment.

In FIG. 16, although the C1 layer 210A and the C2 layer 210B are disposed above the L layer 250, the order of each layer is not particularly limited as long as the electrical connection relationship is the same, and, for example, as illustrated in a package board 200CA of FIG. 17, the L layer 250 may be disposed between the C1 layer 210A and the C2 layer 210B. Alternatively, the C1 layer 210A and the C2 layer 210B may be disposed below the L layer 250. Moreover, since, as shown in FIG. 17, the configuration in which the L layer 250 is disposed between the C1 layer 210A and the C2 layer 210B has a vertically symmetric structure in the lamination direction, the warpage of the entire package board can be suppressed.

In the example in FIG. 16, C layers are provided in order to increase the capacitance, but when an increase in the inductance is required, a configuration in which L layers are provided is also possible.

Sixth Embodiment

In the fifth embodiment, the configuration in which the C layer or the L layer is made up of multiple layers in order to increase the capacitance and/or the inductance has been described.

On the other hand, when the size of the semiconductor composite device in the height direction is limited, there may be a case where the formation of multiple layers cannot be performed as in the fourth embodiment.

In a sixth embodiment, when the capacitance and/or inductance needs to be increased under the condition that the size restriction in the height direction is tight, but the size restriction in a plane direction is loose to some extent, a configuration for securing desired capacitance and inductance by coupling C layers and L layers in a plane will be described.

Figure 18:
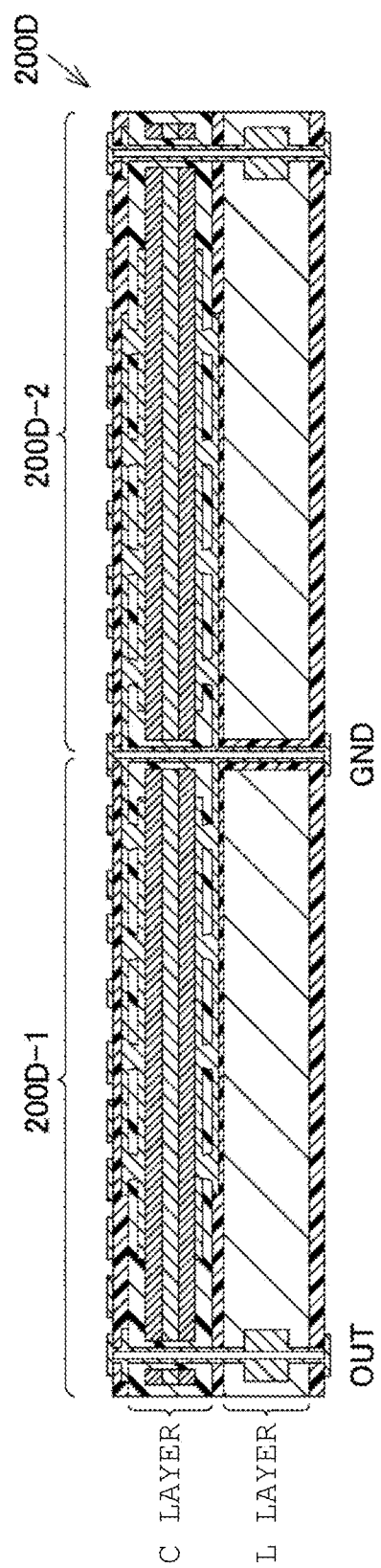
FIG. 18 is a sectional view of a semiconductor composite device according to a sixth embodiment.

FIG. 18 is a sectional view of a package board 200D of the semiconductor composite device according to the sixth embodiment. In the package board 200D of FIG. 18, two package boards 200D-1 and 200D-2 corresponding to the package board 200 described in the first embodiment share a through hole connected to the ground terminal GND, and are coupled with each other in a plane direction.

With such a configuration, although the mounting area of the package board is large, capacitance and inductance can be increased while maintaining the dimension in the height direction. Such a configuration can be effective when the demand for the reduction in height is particularly severe.

Seventh Embodiment

The through holes 266 to 268 illustrated in FIGS. 13 to 15 may be provided for each device mounted on the package board. When forming a through hole, it is necessary to surround the through hole with an insulating material to insulate the through hole from conductors such as coils, capacitors and wiring patterns formed in the package board. Therefore, when the through holes 266 to 268 are individually formed around the package board, a portion occupied by the insulating material around the holes increases. For this reason, there is a possibility that reduction in the area of the mounting face of the package board is restricted, and, consequently, size reduction is hindered, and the desired capacitance and inductance cannot be implemented.

In a seventh embodiment, a configuration will be described in which the through holes 266 to 268, as described with reference to FIGS. 13 to 15, other than the through holes 260, 262, and 264 through which the main current of the package board flows, are disposed adjacent to each other, and are surrounded by a common insulating material.

Figure 19:
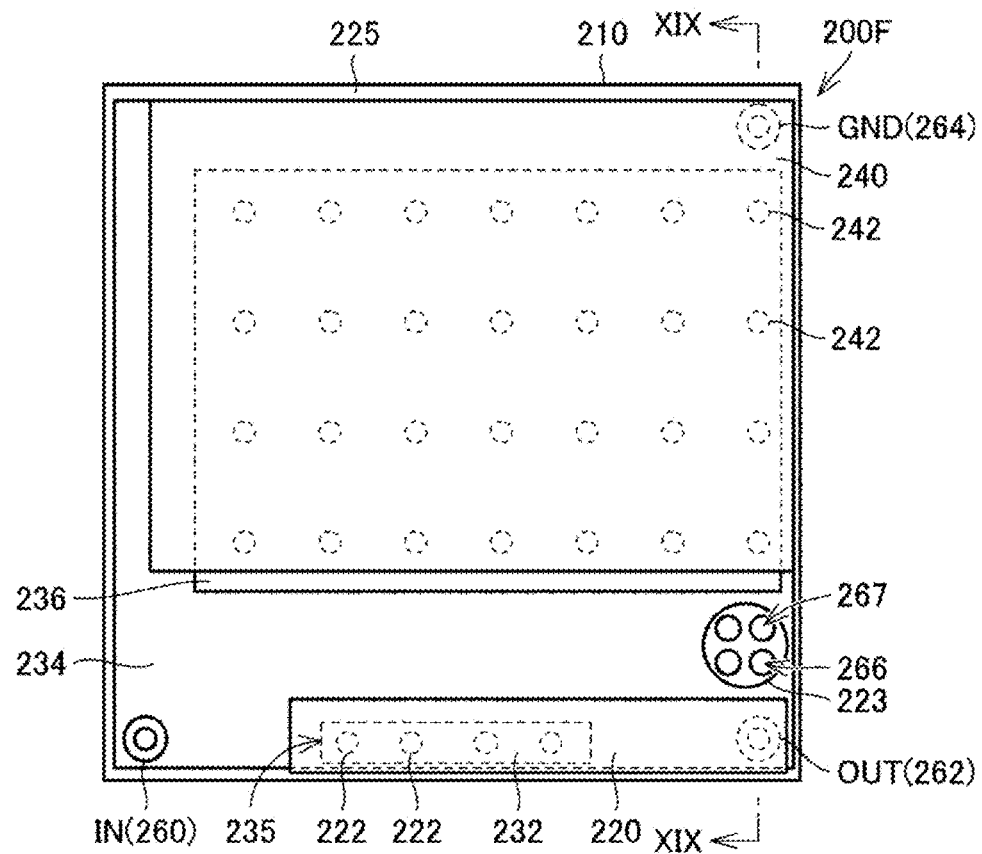
FIG. 19 is a plan view of a C layer of a semiconductor composite device according to a seventh embodiment.
Figure 20:
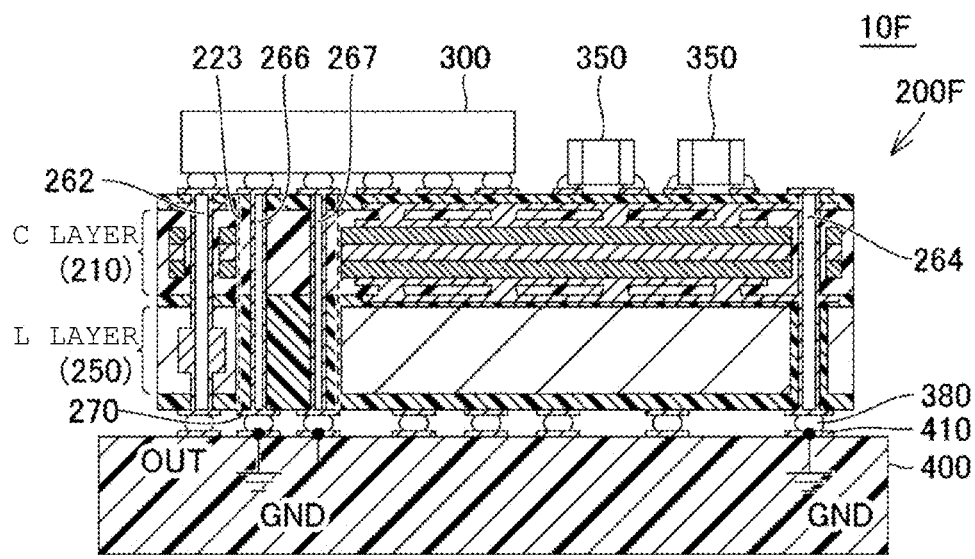
FIG. 20 is a sectional view of the semiconductor composite device in FIG. 19 taken along line XIX-XIX.

FIG. 19 is a plan view of the C layer 210 of a semiconductor composite device 10F according to the seventh embodiment, and FIG. 20 is a sectional view taken along line XIX-XIX in FIG. 19.

Referring to FIGS. 19 and 20, a via 223 filled with an insulating material is formed in a portion that does not overlap with the respective electrodes of the capacitor of the C layer 210 and the coil portion 252 of the L layer 250. Then, the signal through holes 266 and 267 are formed in the via 223. FIG. 19 illustrates an example in which a through hole other than the through holes 266 and 267 is provided in the via 223.

In this way, by forming the signal through holes for the mount device in a common via filled with the insulating material, the proportion of the insulating material required to form the through holes 266 to 268 can be reduced on the mounting face, so that factors that hinder size reduction can be reduced. In addition, since it is only necessary to perform the insulation process on the inside of the common via, the number of processing steps can be reduced compared with the case where the insulation process is performed on individual through holes.

Eighth Embodiment

In the first to seventh embodiments described above, a configuration has been described in which the circuit layer 205 for mounting the voltage regulator 100 and the load 300, and the terminal layer 270 for mounting the semiconductor composite device 10 on a mother board are formed as one layer on the front and back faces of the package board 200.

In an eighth embodiment, an example in which the circuit layer and/or the terminal layer has a multilayer structure will be described.

Figure 21:
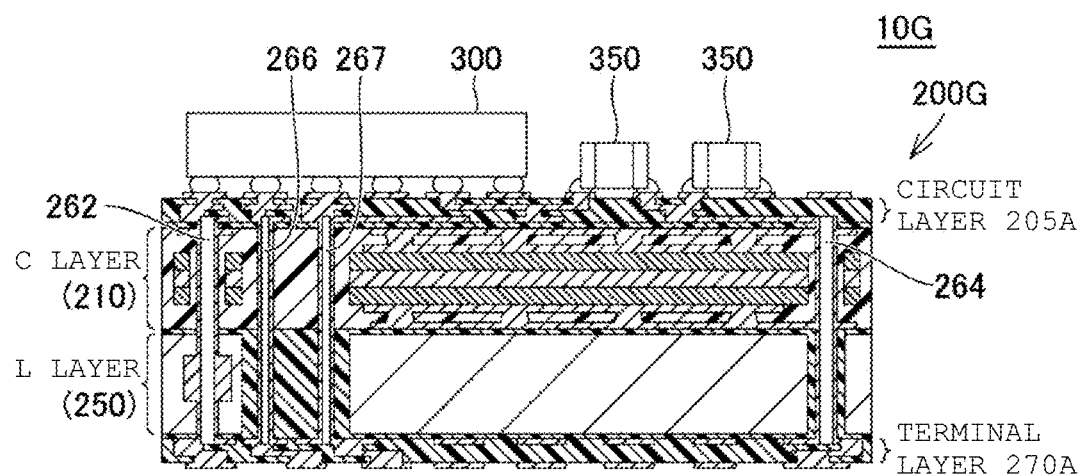
FIG. 21 is a sectional view of a semiconductor composite device according to an eighth embodiment.

FIG. 21 is a sectional view of a semiconductor composite device 10G according to the eighth embodiment. In a package board 200G of the semiconductor composite device 10G, a circuit layer 205A having a multilayer structure including wiring patterns is disposed on the face, of the C layer 210 on the side that does not face the L layer 250, and the load 300 and other electronic devices 350 are mounted on the surface of the circuit layer 205A.

In addition, a terminal layer 270A having a multilayer structure including wiring patterns is disposed on the face, of the L layer 250 on the side that does not face the C layer 210.

In the package board 200G of FIG. 21, the through holes 262, 264, 266, and 267 penetrate the C layer 210 and the L layer 250, but do not penetrate the circuit layer 205A and the terminal layer 270A. That is, the through holes 262, 264, 266, and 267 are formed after the C layer 210 and the L layer 250 are joined, and thereafter, the circuit layer 205A is formed on the upper face of the C layer 210, and the terminal layer 270A is formed on the lower face of the L layer.

In this way, by forming the circuit layer 205A and the terminal layer 270A in a multilayer structure, a wiring pattern to which a device mounted on the mounting face (the surface of the circuit layer 205A) is connected is formed on a layer inside the circuit layer 205A, so that wiring patterns formed on the mounting face can be reduced. Therefore, the surface area of the mounting face can be reduced such that the capacitance of the capacitor portion 230 of the C layer 210 and the inductance of the coil portion 252 of the L layer 250 are not hindered, so that the size of the semiconductor composite device can be reduced, compared with the case where the circuit layer and the terminal layer are formed as a single layer.

Figure 22:
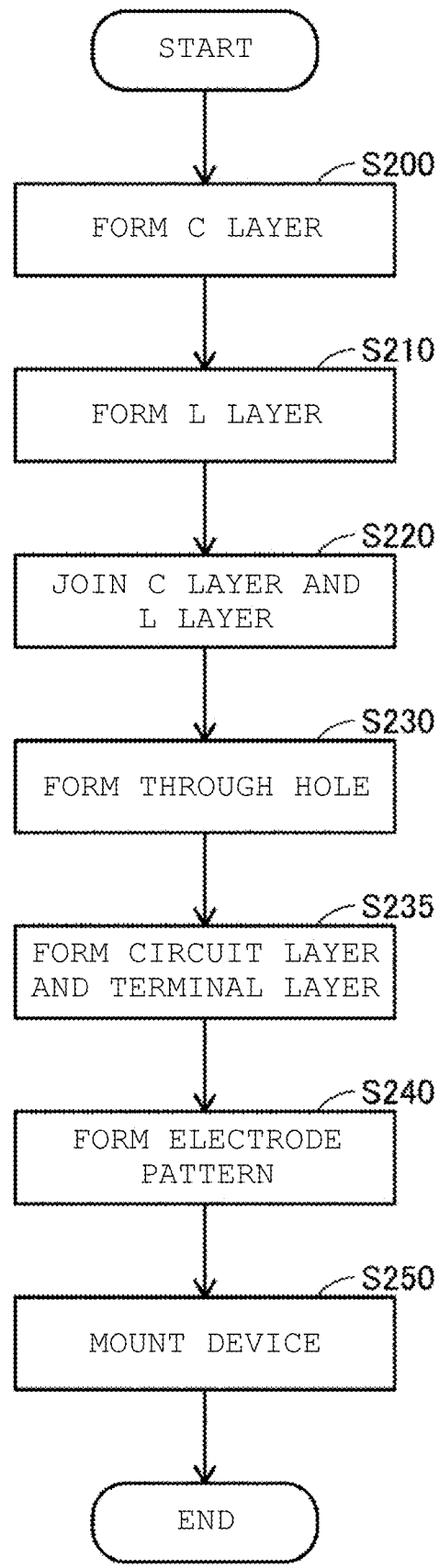
FIG. 22 is a flowchart illustrating a manufacturing process of the semiconductor composite device in FIG. 21.
Figure 25A:
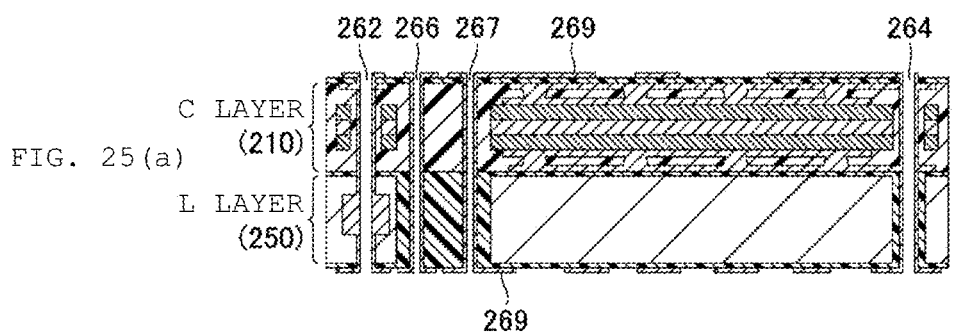
FIGS. 25(a)-(b) are third diagrams for describing the details of the manufacturing process of the semiconductor composite device in FIG. 21.
Figure 25B:
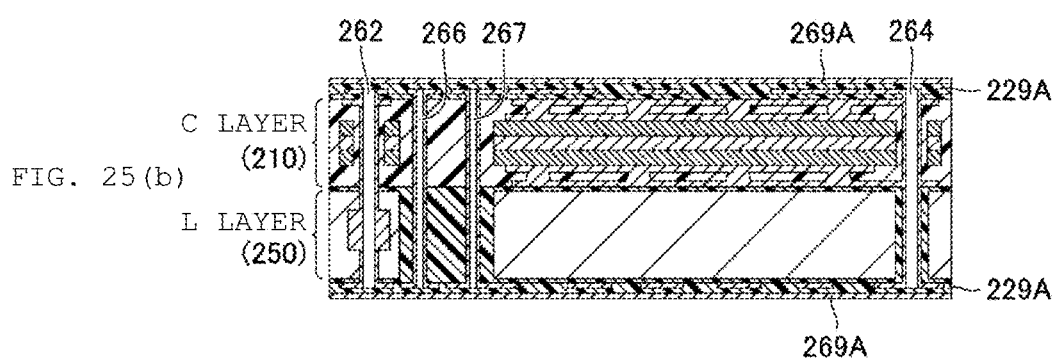

The manufacturing process of the semiconductor composite device 10G according to the eighth embodiment will be described with reference to FIGS. 22 to 27. FIG. 22 is a flowchart for describing the outline of the manufacturing process, and FIGS. 23 to 27 are diagrams for describing the details of the steps in the flowchart in FIG. 22.

In the flowchart in FIG. 22, steps S200 to S230, S240, and S250 correspond to steps S100 to S130, S140, and S150 in the flowchart illustrated in FIG. 7, respectively, and substantially, step S235 is added to the flowchart in FIG. 7 described in the first embodiment.

Referring to FIG. 22, in S200 and S210, the C layer 210 and the L layer 250 are individually formed (FIG. 23(a)). Thereafter, in S220, the formed C layer 210 and L layer 250 are joined and integrated using the resin layers 226, 227, and 228 (FIG. 23(b)).

Next, in S230, a through hole is formed in the integrated C layer 210 and L layer 250. More specifically, first, as illustrated in FIG. 24(a), a penetration hole is formed by drilling or laser processing at a position where the through hole is to be formed in the joined C layer 210 and L layer 250. Then, the through hole is formed by metallizing the inside of the penetration holes by electroless Cu plating or the like (FIG. 24(b)).

Thereafter, in S235, the circuit layer 205A is formed on the resin layer 226, and the terminal layer 270A is formed on the resin layer 228. In particular, first, the metal layer 269 on the surface of the resin layers 226 and 228 is patterned using a photoresist to form a wiring pattern by removing unnecessary Cu by etching (FIG. 25(a)). Then, a resin layer 229A and a metal layer 269A are disposed thereon (FIG. 25(b)).

Figure 26A:
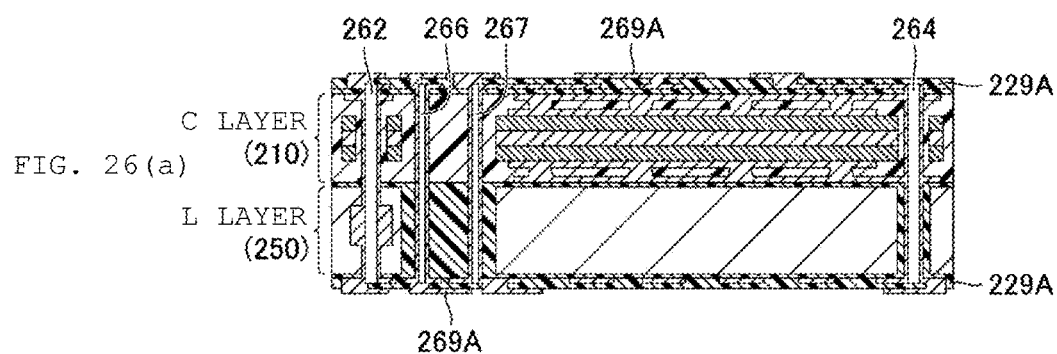
FIGS. 26(a)-(b) are fourth diagrams for describing the details of the manufacturing process of the semiconductor composite device in FIG. 21.
Figure 26B:
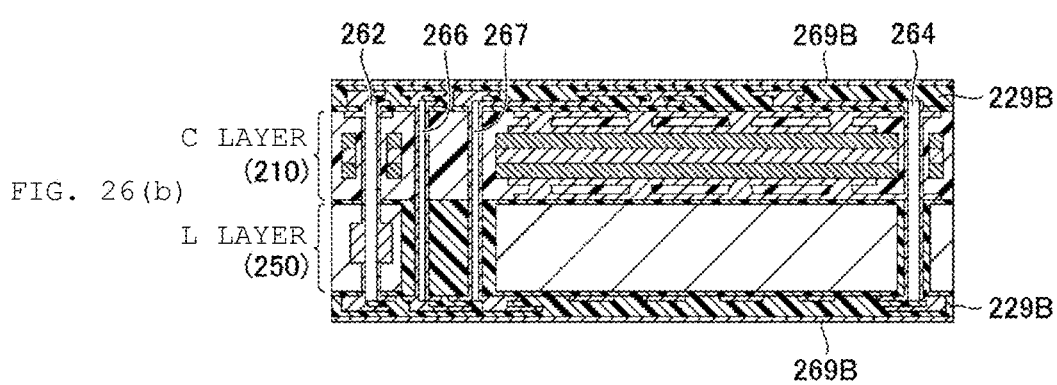

Further, a wiring pattern is formed by patterning the metal layer 269A (FIG. 26(a)), and a resin layer 229B and a metal layer 269B are further disposed on the patterned metal layer 269A (FIG. 26(b)).

After the desired number of wiring layers are formed by repeating the steps illustrated in FIGS. 25(a)-(b) and 26(a)-(b), the outermost metal layer 269B is patterned and etched to form an electrode pattern for mounting the device and connecting it to the solder bump on the mounting board, and a wiring pattern for connecting these electrode patterns in S240. Thus, the circuit layer 205A and the terminal layer 270A are formed, and the package board 200G is completed (FIG. 27(a)).

Figure 27A:
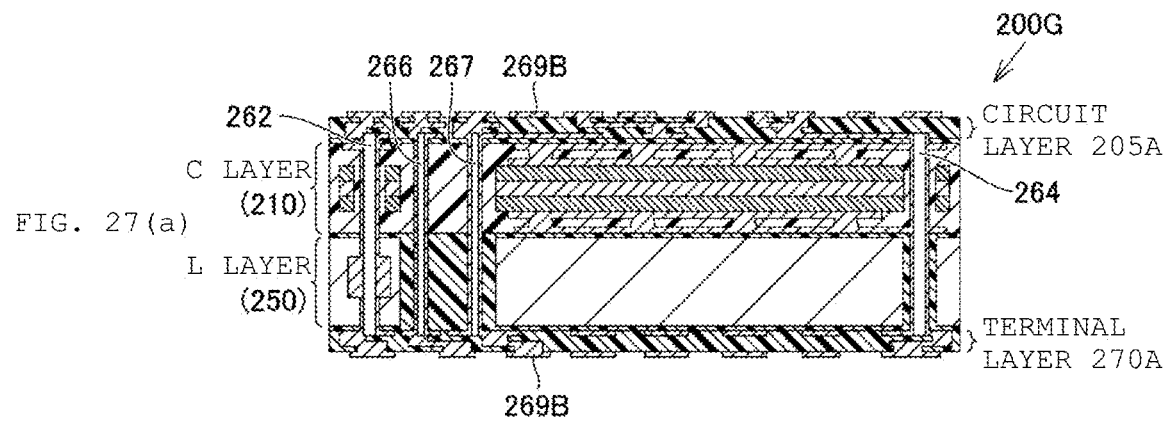
FIGS. 27(a)-(b) are fifth diagram for describing the details of the manufacturing process of the semiconductor composite device in FIG. 21.
Figure 27B:
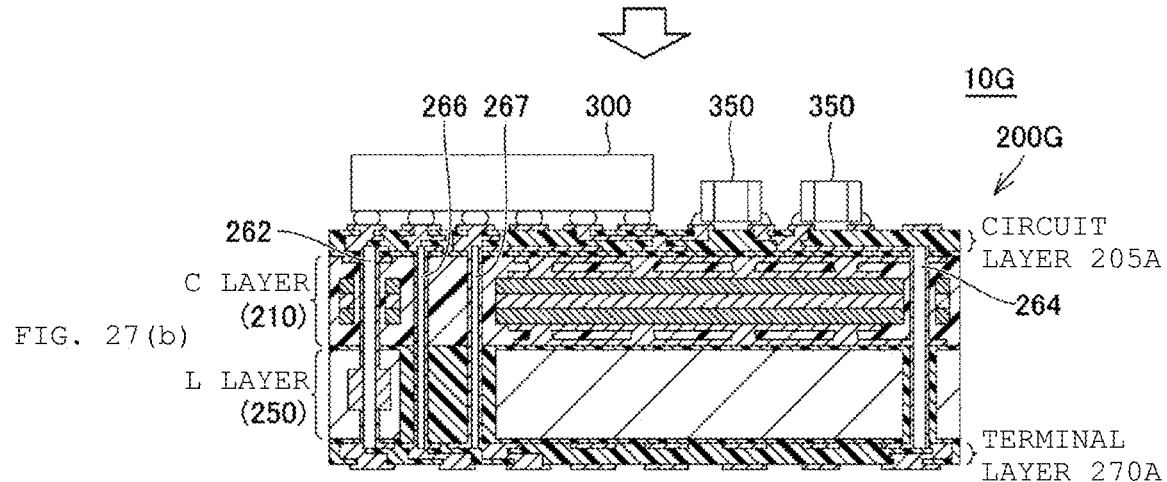

Thereafter, in S250, devices such as the voltage regulator 100 are mounted on the completed package board 200G (FIG. 27(b)).

In the above description, although the example in which both the circuit layer 205A and the terminal layer 270A have a multilayer structure has been described, only one of the circuit layer 205A and the terminal layer 270A may have a multilayer structure. Further, the circuit layer 205A and the terminal layer 270A may have different numbers of layers.

In this way, by using circuit layers and/or terminal layers with a multilayer structure on the front and back faces of the package board, the wiring width and the wiring pitch of the wiring between the devices to be mounted can be secured, so that the surface area of the mounting face can be reduced, and it is possible to cope with needs for further size reduction.

(Modification 1)

Figure 28:
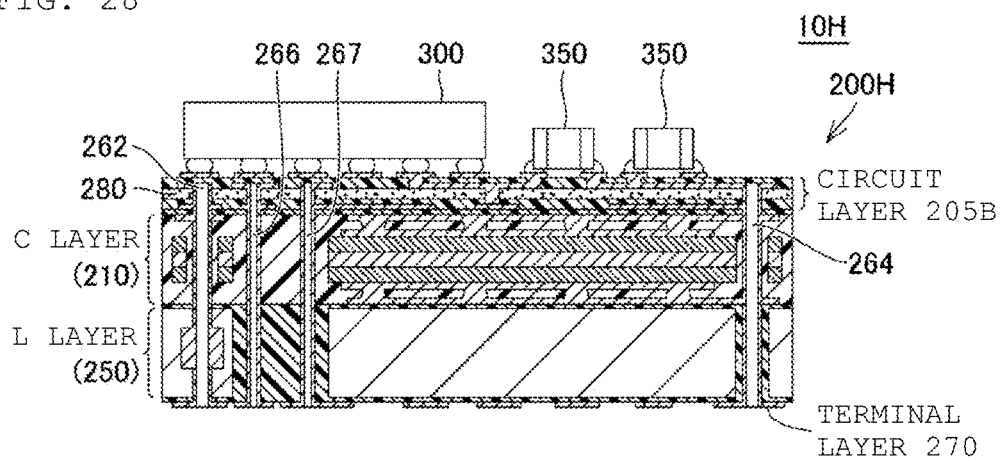
FIG. 28 is a sectional view of a semiconductor composite device according to Modification 1 of the eighth embodiment.

FIG. 28 is a sectional view of the first modification (i.e., Modification 1) of the semiconductor composite device having the circuit layer with the multilayer structure illustrated in the eighth embodiment.

Referring to FIG. 28, in a semiconductor composite device 10H according to Modification 1, a core substrate 280 containing glass cloth is disposed in a multilayer circuit layer 205B of a package board 200H.

In the manufacturing process of the package board, since a compressive force is applied when the respective layers are joined, distortion may occur due to the influence of the compressive force and cracks may occur. In particular, since the circuit layer does not include a rigid metal member such as the electrodes 232 and 236 of the C layer 210 or the coil portion 252 of the L layer 250, so that distortion due to an external force is likely to occur. Therefore, the strength of the circuit layer can be secured by disposing the core substrate 280 in the circuit layer.

It is noted that the material of the core substrate 280 is not limited to glass cloth as long as the material has insulating properties and rigidity. As a material of the core substrate 280, for example, a metal core including a metal member (for example, Cu) whose surface has been subjected to insulation treatment can be used.

Figure 29:
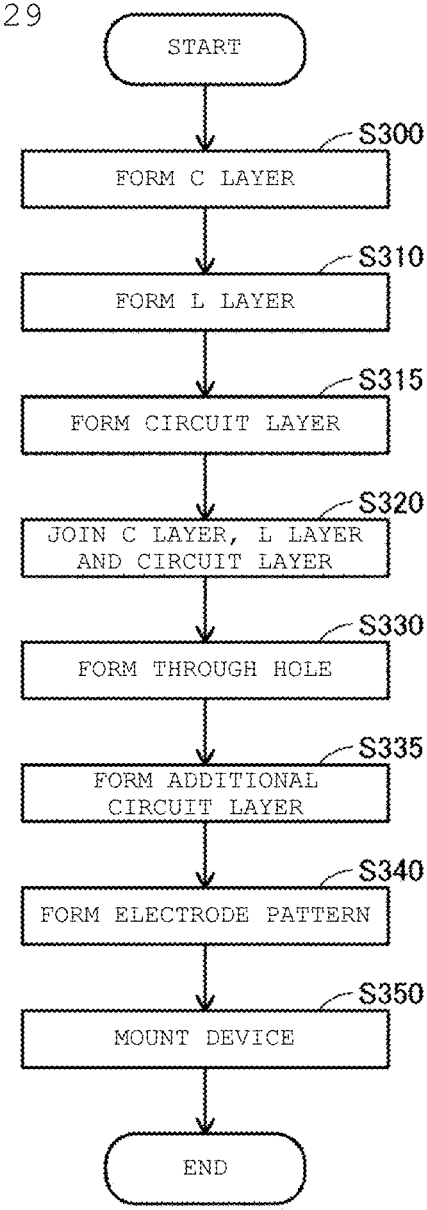
FIG. 29 is a flowchart illustrating a manufacturing process of the semiconductor composite device in FIG. 28.

FIG. 29 is a flowchart illustrating a manufacturing process of the semiconductor composite device 10H of FIG. 28. Referring to FIG. 29, in S300 and S310, the C layer 210 and the L layer 250 are individually formed. Further, in the eighth embodiment, in S315, a portion including the core substrate 280 of the circuit layer 205B is formed. Here, in S315, only a portion, of the circuit layer 205B, where the through hole together with the C layer 210 and the L layer 250 is formed is formed.

Thereafter, in S320, parts of the C layer 210, the L layer 250, and the circuit layer 205B individually formed in S300, 310, and 315 are joined using a resin layer. Then, in S330, the through hole is formed in the integrated C layer 210, L layer 250, and circuit layer.

After forming the through hole, in S335, a resin layer and a metal layer are disposed on the joined circuit layer, when necessary, to form an additional wiring layer. Although an example in which the terminal layer is a single layer is illustrated in the package board 200H in FIG. 28, the terminal layer may have a multilayer structure as in FIG. 21 of the eighth embodiment. In this case, in S335, an additional wiring layer is also formed on the terminal layer.

Then, in S340, the metal layer on the surface of the circuit layer 205B and the terminal layer 270 is patterned to form an electrode pattern and a wiring pattern. Thus, the package board 200H is completed. In S350, the semiconductor composite device 10H is completed by mounting devices such as the voltage regulator 100 and the load 300 on the mounting face of the completed package board 200H.

(Modification 2)

Figure 30:
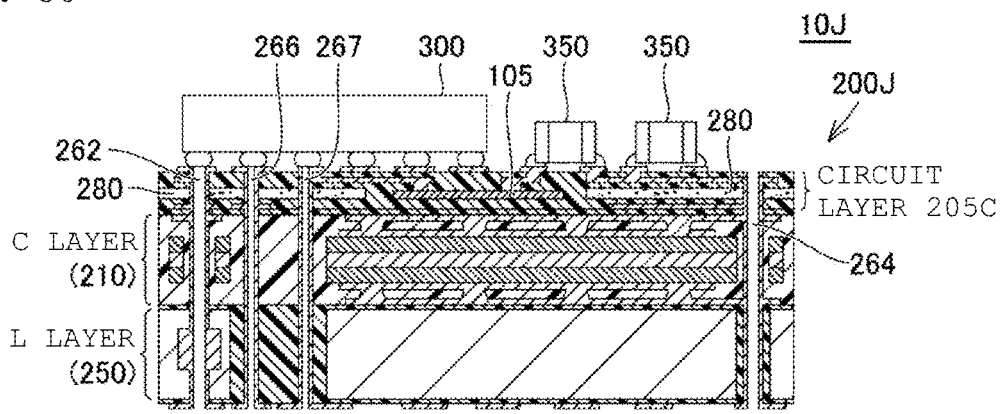
FIG. 30 is a sectional view of a semiconductor composite device according to Modification 2 of the eighth embodiment.

FIG. 30 is a sectional view of a second modification (i.e., Modification 2) of the semiconductor composite device having the circuit layer having the multilayer structure illustrated in the eighth embodiment.

Referring to FIG. 30, a semiconductor composite device 10J according to Modification 2 has a configuration in which a semiconductor active element 105 of the voltage regulator 100 is embedded in a circuit layer 205C having a multilayer structure. The active element 105 is preferably disposed on the layer on which the core substrate 280 illustrated in Modification 1 is formed, in order to reduce the influence of distortion (e.g., warpage, cracking and the like) due to an external force or the like.

In the manufacturing process, when a circuit layer including the core substrate 280 is formed in step S315 in FIG. 29 described in Modification 1, part of the core substrate 280 is removed, and the active element 105 is disposed at the removed portion. It is noted that, from the viewpoint of size reduction, the active element 105 is preferably disposed so as to overlap with the load 300 when the package board 200J is viewed in plan view from the normal direction of the mounting face.

In this way, the distance of the electric path from the voltage regulator 100 to the load 300 through the L layer 250 and the C layer 210 can be reduced by embedding the active element 105 of the voltage regulator 100 in the circuit layer 205C, so that it is possible to reduce the loss generated in the electric path.

It is also noted that not only the active element 105, but also the entire voltage regulator 100, can be embedded in the circuit layer 205C.

Ninth Embodiment

In the first to eighth embodiments, a configuration in which the through hole penetrates both the C layer 210 and the L layer 250 has been described.

In a ninth embodiment, an example of a configuration in which a package board includes a through hole penetrating only one of the C layer 210 and the L layer 250 in addition to a through hole penetrating both the C layer 210 and the L layer 250 will be described.

Figure 31:
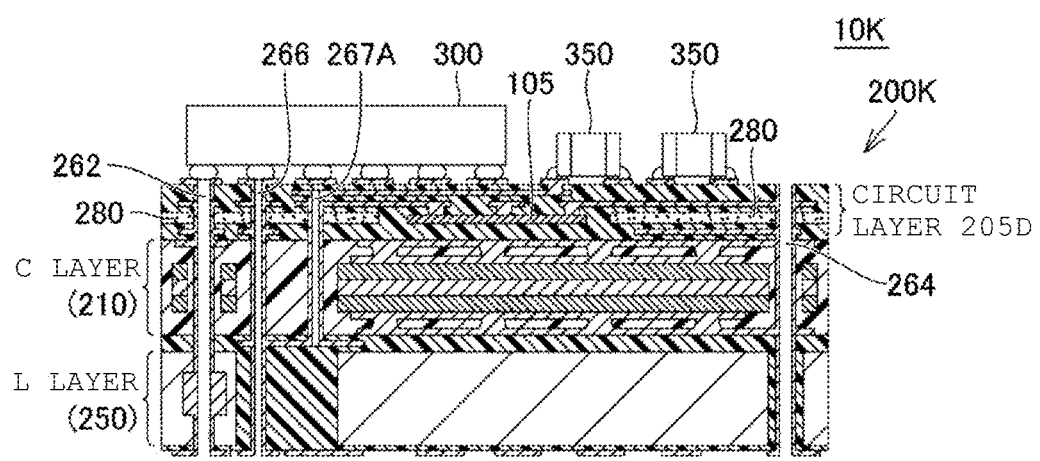
FIG. 31 is a sectional view of a semiconductor composite device according to a ninth embodiment.

FIG. 31 is a sectional view of a semiconductor composite device 10K according to the ninth embodiment. In a package board 200K of the semiconductor composite device 10K, a through hole 267A penetrating the C layer 210 and part of a circuit layer 205D, but not penetrating the L layer 250, is formed. Such a through hole is formed for the purpose of making a connection to the C layer without affecting the L layer, for example, when a capacitor is required in the circuit or in the input section of the voltage regulator 100 mounted on the circuit layer.

Figure 32:
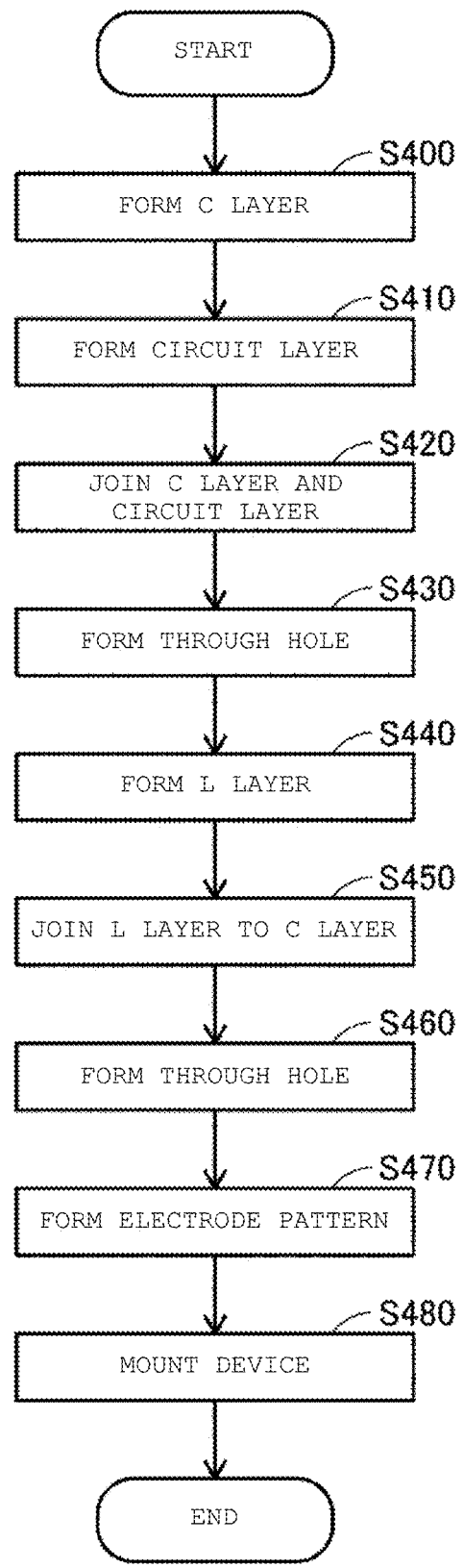
FIG. 32 is a flowchart illustrating a manufacturing process of the semiconductor composite device in FIG. 31.

Next, a manufacturing process of the semiconductor composite device 10K according to the ninth embodiment will be described with reference to FIGS. 32 to 35. FIG. 32 is a flowchart for describing the outline of the manufacturing process, and FIGS. 33 to 35 are diagrams for describing the details of the steps in the flowchart in FIG. 32.

Referring to FIG. 32, the C layer 210 is formed in S400, and a circuit layer 205E, which is part of the circuit layer 205D, is formed in S410. Then, in S420, the C layer 210 and the circuit layer 205E formed in S400 and S410, respectively, are joined using a resin layer 292. Further, a metal layer 269C is formed on a face of the C layer 210, which is opposite to a face facing the circuit layer 205E with a resin layer 291 interposed therebetween, and the metal layer 269C is formed on a face of the circuit layer 205E, which is opposite to a face facing the C layer 210 with a resin layer 293 interposed therebetween (FIG. 33(a)).

Thereafter, in S430, the through hole 267A is formed in the integrated C layer 210 and circuit layer 205E. Specifically, a penetration hole is formed at a position where the through hole 267A is to be formed by drilling or laser processing (FIG. 33(b)). Then, the through hole 267A is formed by metallizing the inside of the penetration hole by electroless Cu plating or the like (FIG. 33(c)). In FIG. 33(c), the metal layer 269C on the surface of the resin layers 291 and 293 is etched to form a wiring pattern.

Figure 34A:
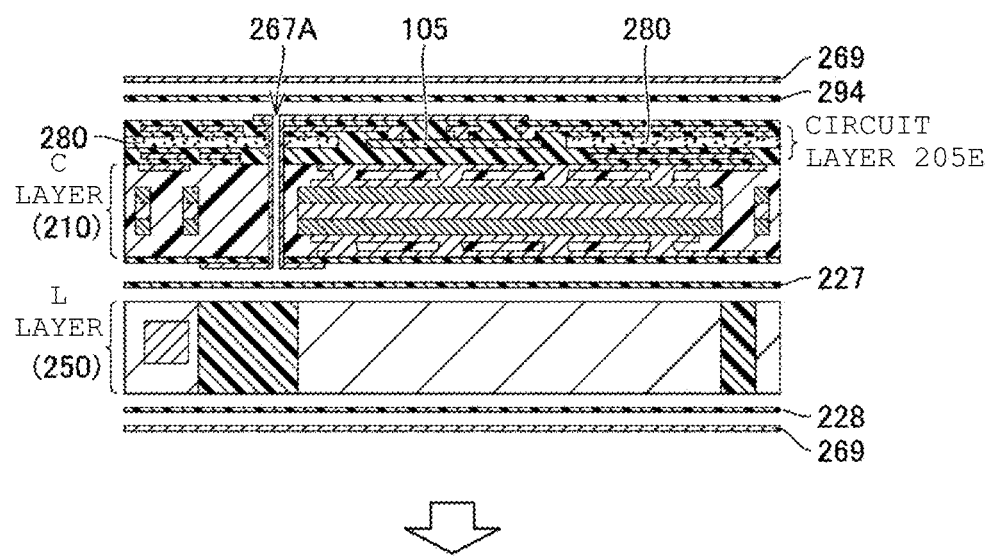
FIGS. 34(a)-(b) are second diagrams for describing the details of the manufacturing process of the semiconductor composite device in FIG. 31.
Figure 34B:
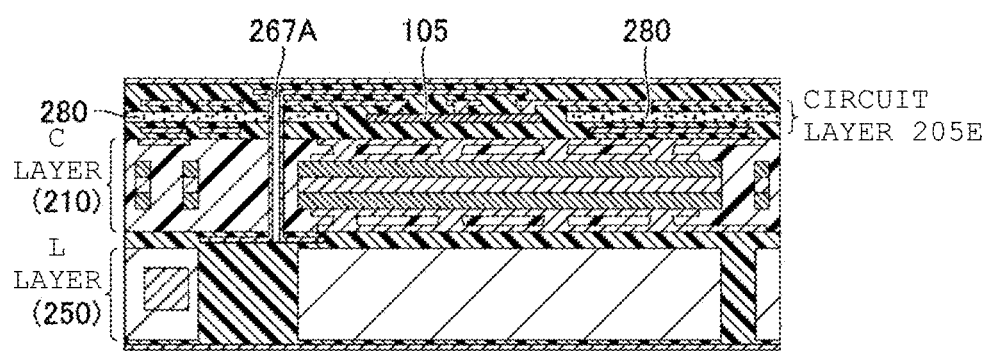

When the through hole 267A penetrating the C layer 210 and the circuit layer 205E is formed, next, the L layer 250 is individually formed in S440 (FIG. 34(a)), and the L layer 250 is joined to the C layer 210 using the resin layer 227 in S450 (FIG. 34(b)). Further, the metal layer 269 is disposed on a face of the L layer 250, which is opposite to a face facing the C layer 210 with the resin layer 228 interposed therebetween. The metal layer 269 is disposed on the surface of the circuit layer 205E with a resin layer 294 interposed therebetween.

Figure 35A:
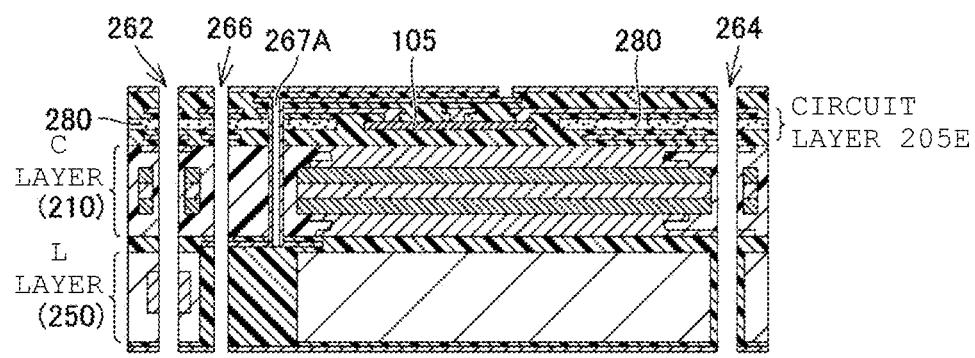
FIGS. 35(a)-(b) are third diagrams for describing the details of the manufacturing process of the semiconductor composite device in FIG. 31.
Figure 35B:
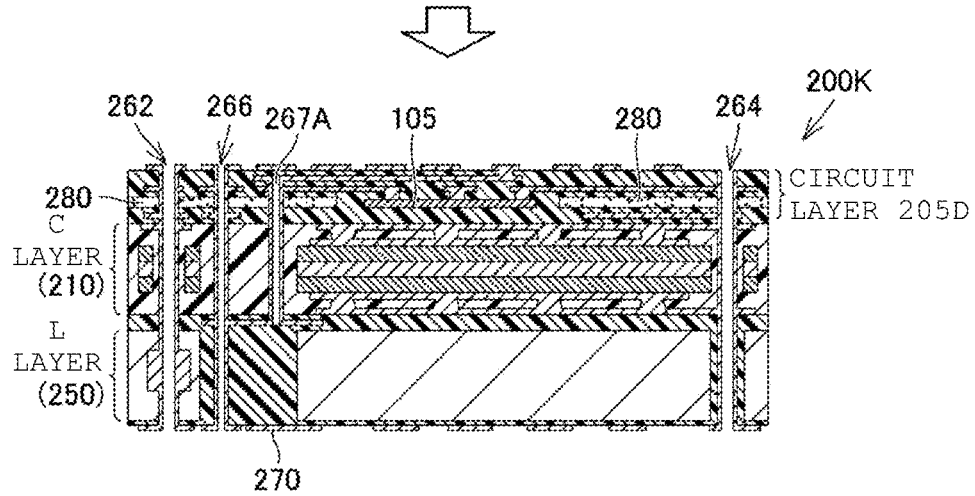

Thereafter, in S460, the through hole penetrating the circuit layer 205E, the C layer 210 and the L layer 250 integrated is formed, and in S470, the metal layer 269 on the surface is etched to form an electrode pattern or a wiring pattern (FIGS. 35(a) and (b)). Thus, the package board 200K is completed. Although not illustrated in FIG. 35, more wiring layers may be formed for the circuit layer. Further, the terminal layer 270 may have a multilayer structure.

Then, in S480, devices such as the load 300 are mounted on the mounting face of the circuit layer 205D, and the semiconductor composite device 10K is formed.

In the above example, although the configuration in which the through hole 267A penetrating the C layer 210 but not penetrating the L layer 250 is formed has been described, depending on the circuit configuration, a through hole that does not penetrate the C layer 210 but penetrates the L layer 250 may be formed. In this case, a process is performed in which a through hole is formed after the formation of the L layer 250, and thereafter, the L layer 250 is joined to the C layer 210 to form the through hole.

Tenth Embodiment

Example 1

In the above-described semiconductor composite device, the electric power from the voltage regulator is supplied to the load via the through hole of the package board. In order to further improve the efficiency of the semiconductor composite device, it is necessary to reduce the equivalent series resistance (ESR) from the voltage regulator to the load. One way to reduce the ESR is to reduce the resistance value in the through hole.

The through hole formed in the package board has its inner face metallized with a conductive material such as a metal. The resistance value of the through hole can be reduced by increasing the thickness of the metallized layer in the through hole.

In an exemplary aspect, it is desirable to fill the inner hole of the through hole with a metal such as Cu in order to reduce the resistance value of the through hole, but generally, it is known that it is technically difficult to fill a bottomless penetration hole with metal by the plating process, and further, it takes long processing time to perform the plating process until the hole is filled with metal.

The metallization of the through hole is performed by plating process with Cu or the like as described above, and as described in FIG. 11 and the like, when metallizing the through holes, a metal layer (e.g., a metal wiring layer) for forming wiring on the surface of the package board is also formed at the same time. Therefore, when the thickness of the metallized layer of the through hole is increased, the thickness of the metal wiring layer formed on the surface of the package board is also increased.

On the other hand, it is preferable to reduce the thickness of the metal wiring layer in order to form fine wiring in the metal wiring layer, and with the thickness of the metal wiring layer increased, there is a concern that an line and space (L/S), which is the ratio of the wiring to the distance between the wiring lines, will deteriorate.

Therefore, in a tenth embodiment, a configuration is used in which the thickness of the metal wiring layer formed on the surface of the package board is reduced while the thickness of the metallized layer of the through hole is increased. As a result, the resistance value of the through hole can be reduced, and the metal wiring formed on the surface of the package board can be made to be fine.

However, in this case, the metallized layer on the inner face of the through hole and the metal wiring layer on the surface of the package board are connected at the end (connection portion) of the through hole. When the thickness of the conductive member is different in such a connection portion, the current density is concentrated at the connection portion, and the thermal stress due to a difference in coefficient of linear expansion from that of the dielectric board is concentrated, which may cause a problem such as disconnection.

Therefore, in the tenth embodiment, the thickness of the connection portion where the metallized layer and the metal wiring layer are connected is made larger than the thickness of the metal wiring layer. As a result, it is possible to suppress the occurrence of a quality defect at the connection portion.

Figure 37:
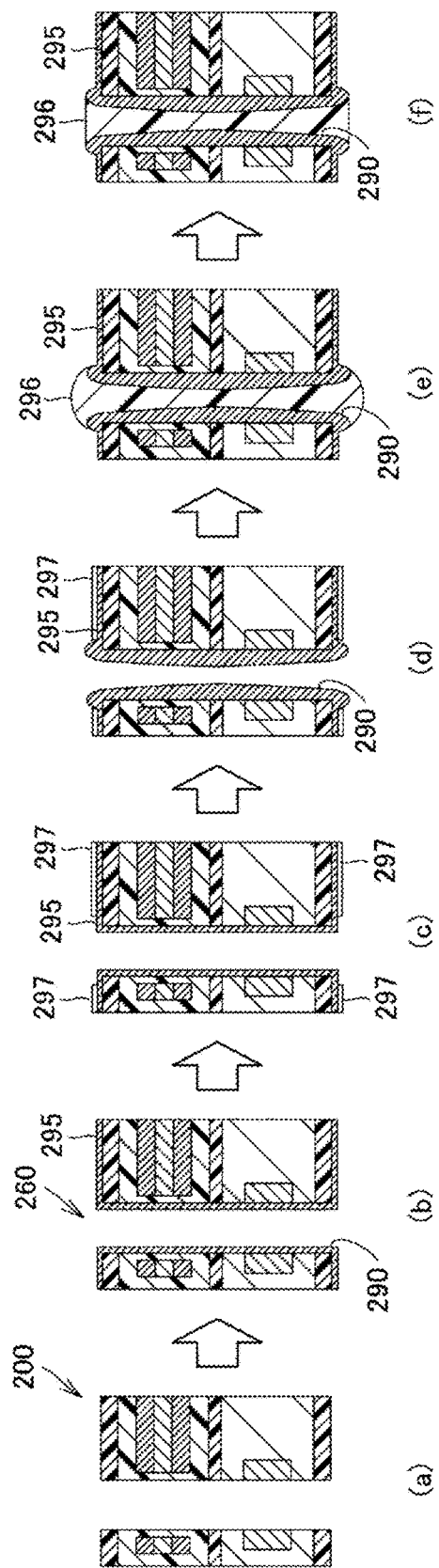
FIG. 37 is a diagram for describing a second example of the plating step for the through hole in the semiconductor composite device according to the tenth embodiment.
Figure 38:
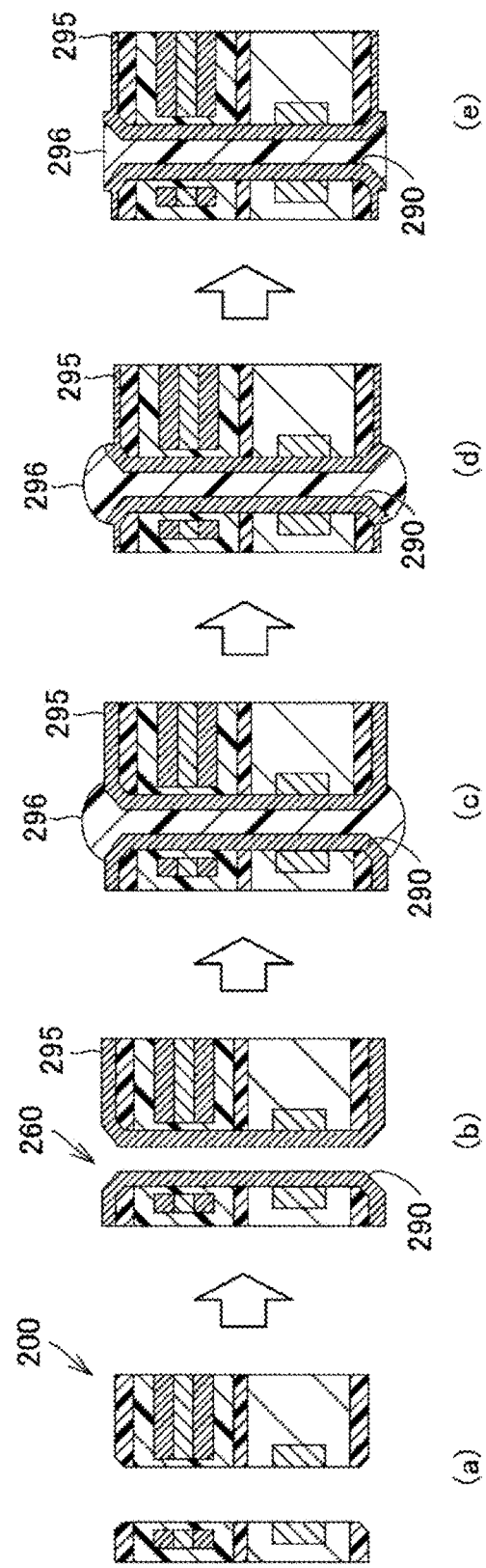
FIG. 38 is a diagram for describing a modification of a portion of the through hole in the semiconductor composite device according to the tenth embodiment.

With reference to FIG. 36, a plating step for the through hole in the semiconductor composite device according to Example 1 of the tenth embodiment will be described. In FIG. 36 and FIGS. 37 and 38 described later, the description of components other than the through hole may be omitted in order to focus on the through hole only.

Referring to FIG. 36, as described in FIG. 11(a) and FIG. 24(a), when a penetration hole is formed in the package board 200 by drilling or the like (step (a) of FIG. 36), then, the inside of the penetration hole and the surface of the package board 200 are metallized by electroless Cu plating or the like to form a metallized layer 290 and a metal wiring layer 295 (step (b) of FIG. 36). At this time, the thickness of the Cu plating layer is a thickness suitable for the thickness of the metallized layer 290 to be formed on the inner face of the through hole 260. Therefore, at this stage, the metal wiring layer 295 formed on the surface of the package board 200 has a thickness larger than a desired thickness.

After the Cu plating process is performed, the space inside the through hole 260 is filled with a resin 296 by a printing method or the like (step (c) of FIG. 36). At this time, part of the metal wiring layer 295 near the through hole 260 is also covered with the resin 296.

Thereafter, the metal wiring layer 295 is subjected to wet etching to thin the metal wiring layer 295 to a desired thickness (step (d) of FIG. 36). At this time, the portion covered with the resin 296 is not etched and the thickness of the plating layer is maintained. Therefore, the thickness of the metallized layer 290 is larger than the thickness of the metal wiring layer 295.

After the etching process, the unnecessary portion of the resin 296 is removed by a process such as buff roller polishing (step (e) of FIG. 36).

In this way, by making the metallized layer 290 thicker than the metal wiring layer 295, the conduction resistance of the through hole 260 can be reduced, and the workability of the metal wiring layer 295 can be improved.

It is also noted that, also in the metal wiring layer 295, the portion near the through hole 260 is not etched due to the resin 296, and the thickness of the plating layer is maintained. Thereby, the thickness of the plating layer at the boundary portion (connection portion) between the metallized layer 290 and the metal wiring layer 295 can be increased, so that problems due to thermal stress and the like can be suppressed.

Example 2

In Example 1, an example has been described in which a plating layer is formed to a thickness suitable for the metallized layer in the first plating process, and thereafter, the thickness of the metal wiring layer is reduced by the etching process.

In Example 2, an example is described in which conversely, a plating layer is formed to a thickness suitable for the metal wiring layer in the first plating process, and thereafter, the thickness of the metallized layer of the through hole is increased.

FIG. 37 is a diagram for describing a plating step for a through hole in the semiconductor composite device according to Example 2 of the tenth embodiment. Referring to FIG. 37, when a penetration hole is formed in the package board 200 (step (a) of FIG. 37), the inside of the penetration hole and the surface of the package board 200 are metallized by electroless Cu plating or the like to form the metallized layer 290 and the metal wiring layer 295 (step (b) of FIG. 37). The thickness of the Cu plating layer is a thickness suitable for the metal wiring layer 295.

After the plating process, a resist mask 297 is formed on the surface of the metal wiring layer 295 by photolithography (step (c) of FIG. 37). At this time, the resist mask 297 is not formed in the vicinity of the through hole 260 in the metal wiring layer 295.

Thereafter, the plating process is additionally performed by an electrolytic Cu plating process on the inner face of the through hole 260 and on the portion of the metal wiring layer 295 where the resist mask 297 is not formed (step (d) of FIG. 37). As a result, the thickness of the Cu plating layer in the portion where the resist mask 297 is not formed is larger than that in the portion where the resist mask 297 is formed. The metallized layer 290 in the through hole 260 may have an uneven thickness as long as it is larger than the thickness of the metal wiring layer 295, and for example, as illustrated in step (d) of FIG. 37, the thickness of the central portion of the through hole 260 in the penetration direction may be larger than that of the end.

When the additional plating process is completed, the resist mask 297 is removed by a technique such as organic peeling. Thereafter, as in Example 1, the inside of the through hole 260 is filled with the resin 296 (step (e) of FIG. 37), and the unnecessary portion of the resin 296 is removed by a process such as buff roller polishing (step (f) of FIG. 37).

Also in such a process, the thickness of the metallized layer 290 can be made larger than the thickness of the metal wiring layer 295, and the thickness of the plating layer at the connection portion can be made larger.

Example 3

In Example 1 and Example 2, although the end of the through hole 260 and the surface of the package board 200 are formed to be almost perpendicular, such a shape tends to concentrate current density and thermal stress.

Therefore, in Example 3, the end of the through hole 260 is chamfered to make the angle gentle, thereby reducing the concentration of current density or thermal stress.

FIG. 38 is a diagram for describing a portion of a through hole according to Example 3 of the tenth embodiment. Referring to FIG. 38, in Example 3, when a penetration hole is formed in the package board 200, the end of the penetration hole is chamfered by shot blasting or reaming.

Thereafter, the metallized layer 290 of the through hole and the metal wiring layer 295 are formed by the same process as in Example 1 or Example 2. FIG. 38 illustrates an example in which the metal wiring layer 295 is thinned by etching as in Example 1 of FIG. 36.

By doing this, the resistance value of the through hole can be reduced, and the concentration of current density or thermal stress at the boundary portion between the through hole and the metal wiring layer can be reduced.

It is noted that, Examples 1 to 3 of the tenth embodiment may be applied to all through holes formed in the package board, or may be applied to some (at least one) of the through holes.

As described above, the package board of the semiconductor composite device according to the present embodiment has a configuration in which the C layer in which the capacitor is formed and the L layer in which the inductor is formed are laminated. In such a laminated structure, when the coefficient of linear expansion of the entire C layer and the coefficient of linear expansion of the entire L layer are different, the package board may be warped due to a temperature change during a manufacturing process or the like. Also, in each of the C layer and the L layer, even a single layer may be warped depending on the structure of each layer.

In the following embodiments 11 to 14, a configuration for suppressing the warpage of a package board will be described.

Eleventh Embodiment

As described in the first embodiment, the anode electrode 232 and the porous layer 234 forming the capacitor portion 230 in the C layer 210 are made of, for example, aluminum (Al) as a main component. On the other hand, the coil portion 252 forming the inductor L1 in the L layer 250 is made mainly of, for example, copper (Cu).

In the manufacturing process of the package board, the C layer 210 and the L layer 250 may be joined by a heating press. Generally, since the coefficient of linear expansion of aluminum is larger than that of copper, the amount of shrinkage during the cooling process of the C layer 210 containing aluminum as a main component is larger than that of the L layer 250 containing copper as a main component. Such a difference in the amount of shrinkage may cause warpage of the package board, cracks in the pressing step, and the like.

Therefore, in the eleventh embodiment, the shrinkage of the C layer is reduced by disposing inside the C layer a core substrate having a smaller coefficient of linear expansion than that of the aluminum, and the warpage, cracking, and the like of the board are suppressed.

Figure 39:
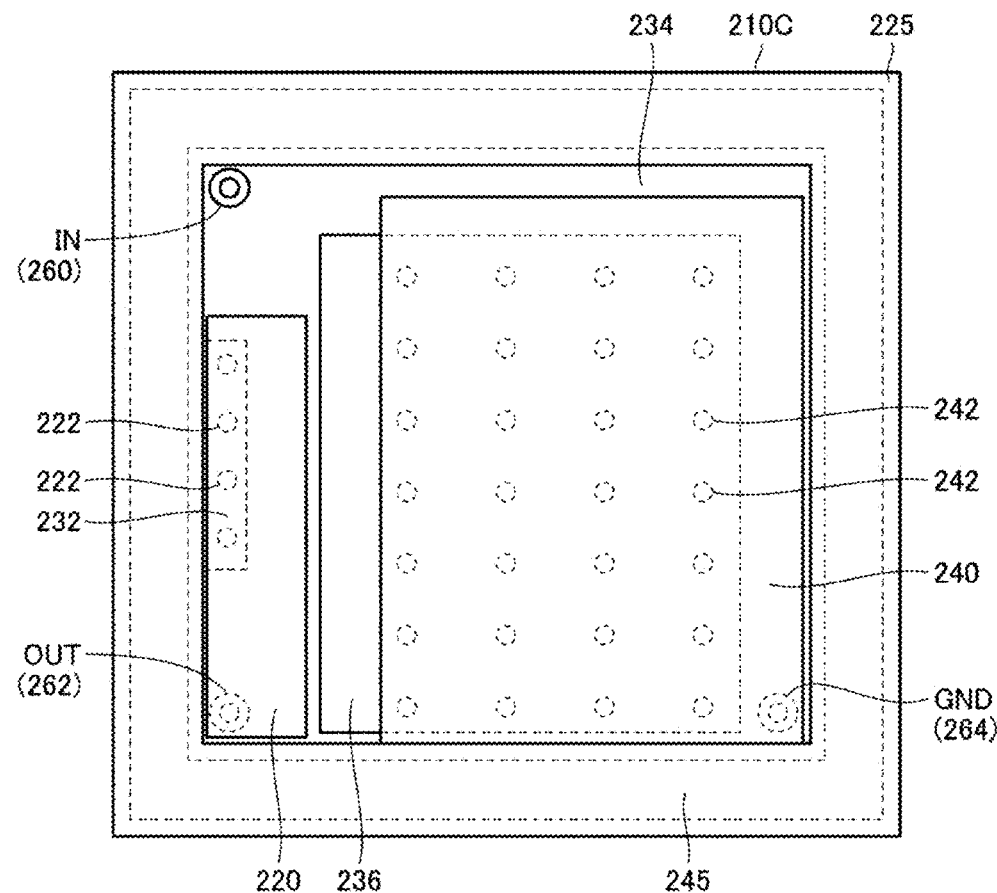
FIG. 39 is a plan view of a C layer in a semiconductor composite device according to an eleventh embodiment.
Figure 40:
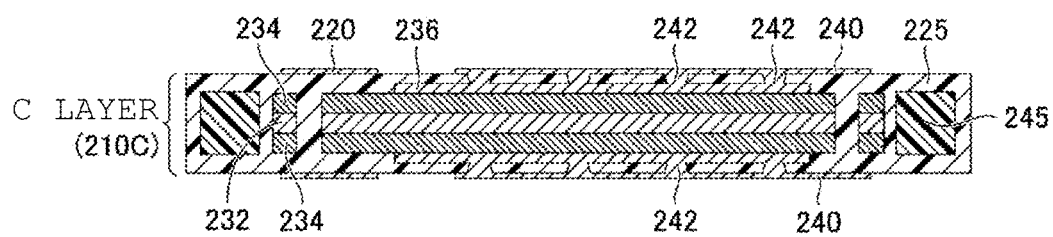
FIG. 40 is a sectional view of a C layer in FIG. 39.

FIGS. 39 and 40 are a plan view and a sectional view, respectively, of a C layer 210C in the semiconductor board according to the eleventh embodiment. Referring to FIGS. 39 and 40, the configuration of the C layer 210C is such that a core substrate 245 is disposed so as to surround the periphery of the capacitor portion 230 of the C layer 210 illustrated in FIG. 5.

The core substrate 245 is formed of, for example, a material in which glass cloth is contained in a resin such as epoxy, and has a coefficient of linear expansion smaller than that of aluminum. More preferably, the coefficient of linear expansion of the core substrate 245 is close to the coefficient of linear expansion of copper contained as the main component of the L layer 250. By disposing such a core substrate 245 inside the C layer 210C, the strength of the C layer 210C itself can be improved, and the difference in coefficient of linear expansion from the L layer 250 is decreased, so that warpage and cracking of the package board in the manufacturing process can be suppressed.

The C layer 210C is generally formed by the following process. First, the inside of the flat core substrate 245 having a substantially rectangular shape is removed to form a frame shape, and the capacitor portion 230 of the first embodiment illustrated in FIG. 8(a) is disposed in the frame. Then, the core substrate 245 and the capacitor portion 230 are collectively sealed with a resin such as epoxy (insulating portion 225). Thereafter, the C layer 210C is formed by forming the conductive portions 220 and 240 according to the process illustrated in FIGS. 8(b) and 8(c) of the first embodiment.

(Modification of Core Substrate)

In FIGS. 39 and 40, an example has been described in which the core substrate has a substantially flat shape on both the front face and the back face. As described later in the twelfth embodiment and the thirteenth embodiment, due to the structure of the C layer, the coefficient of linear expansion may be different between the front face and back face of the C layer. Thus, even the single C layer may be warped in the manufacturing process.

In the following modification, a configuration will be described in which the coefficients of linear expansion of the front face and back face of the C layer are adjusted by making the structures of the front face and back face of the core substrate different.

(Modification 1)

Figure 41:
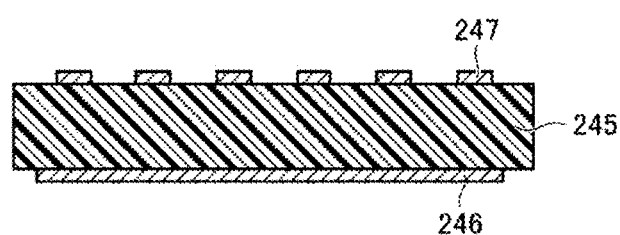
FIG. 41 is a diagram illustrating Modification 1 of a core substrate in FIG. 39.

FIG. 41 is a diagram illustrating the first modification (Modification 1) of the core substrate 254 of FIG. 39. In Modification 1, a metal layer containing copper is formed on the front face and/or back face of the core substrate 245, thereby adjusting the coefficients of linear expansion of the front face and back face of the C layer. In the example of FIG. 41, a metal layer 247 having a mesh-shaped pattern is formed on one face (front face) of the core substrate 245, and a metal layer 246 is formed on the entire other face (back face). As described above, the coefficients of linear expansion of the front face and back face of the C layer can be adjusted by adjusting the amounts of the metal layers on the front and back faces of the core substrate 245.

In FIG. 41, although the example in which the metal layer is provided on both the front face and back face of the core substrate 245 has been described, the case where the metal layer is provided on only one of the front face and the back face may be acceptable. That is, the metal layer may be provided on at least one of the front face and back face of the core substrate 245. In addition, the form of the metal layer can be any shape, and, for example, the metal layers on both sides may be in a mesh shape.

(Modification 2)

Figure 42:
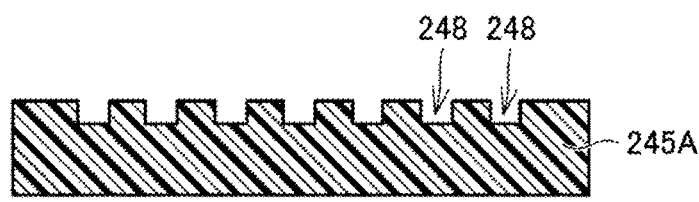
FIG. 42 is a diagram illustrating Modification 2 of the core substrate in FIG. 39.

FIG. 42 is a diagram illustrating the second modification (Modification 2) of the core substrate in FIG. 39. A core substrate 245A according to Modification 2 has a recess 248 on one face of the core substrate 245A to adjust the coefficients of linear expansions of the front face and back face of the C layer. In FIG. 42, the recess 248 is formed only on one face of the core substrate 245A, but the recess 248 may be formed on both the front face and the back face. In this case, the coefficient of linear expansion of the front face and the back face are adjusted by changing the shape or the number of the recesses 248 on the front face and the back face.

(Modification 3)

Figure 43:
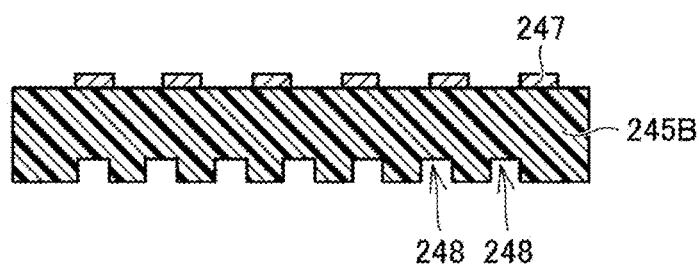
FIG. 43 is a diagram illustrating Modification 3 of the core substrate in FIG. 39.

FIG. 43 is a diagram illustrating the third modification (Modification 3) of the core substrate of FIG. 39. A core substrate 245B of Modification 3 has a configuration in which the metal layer of Modification 1, Modification 2, and the recess are combined. That is, the core substrate 245B has a configuration in which the metal layer 247 is provided on one face and the recess 248 is formed on the other face.

Twelfth Embodiment

Figure 44:
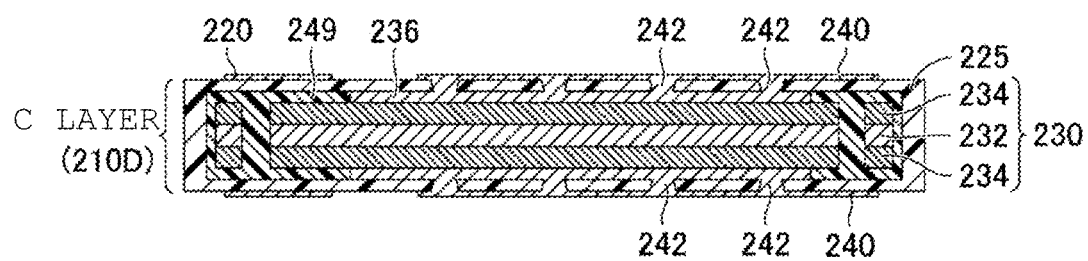
FIG. 44 is a sectional view of a C layer in a semiconductor composite device according to a twelfth embodiment.

FIG. 44 is a sectional view of a C layer 210D in the semiconductor composite device according to the twelfth embodiment. The C layer 210D has a configuration in which the capacitor portion 230 is covered with two different insulating materials.

Referring to FIG. 44, an insulating portion 249 (e.g., first insulation member) is disposed at a portion that contacts the capacitor portion 230, and the insulating portion 225 (e.g., second insulation member) is disposed so as to surround the insulating portion 249. As in the insulating portion 225, the insulating portion 249 is made of a resin such as epoxy, phenol, or polyimide, or the resin and an inorganic filler such as silica or alumina, and has a coefficient of linear expansion different from that of the insulating portion 225.

In an exemplary aspect, the material of the insulating portion 249 is selected so that the difference between the coefficient of linear expansion of the capacitor portion 230 and the coefficient of linear expansion of the insulating portion 249 is smaller than the difference between the coefficient of linear expansion of the capacitor portion 230 and the coefficient of linear expansion of the insulating portion 225. Preferably, the coefficient of linear expansion of insulating portion 249 is a value between the coefficient of linear expansion of the capacitor portion 230 and the coefficient of linear expansion of the insulating portion 225.

In this way, the stress applied to the capacitor portion 230 during the heat treatment in the manufacturing process is reduced by disposing the insulating portion 249 having a smaller difference in coefficient of linear expansion from the capacitor portion 230 around the capacitor portion 230, so that the warpage of the C layer 210D is suppressed. Thereby, deformation and cracking of the entire package board can be suppressed.

Thirteenth Embodiment

Figure 45:
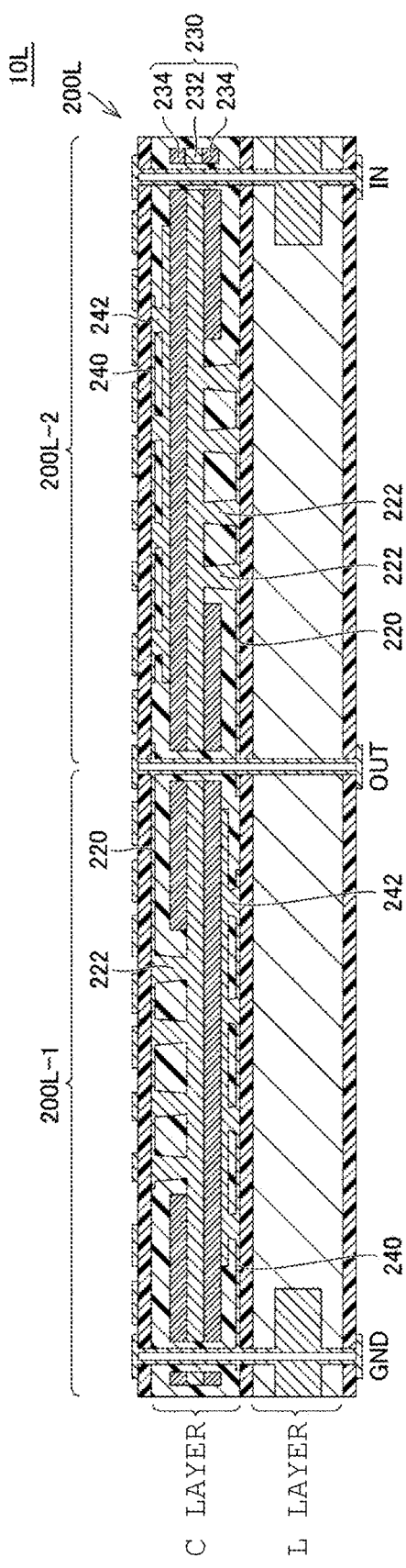
FIG. 45 is a sectional view of a semiconductor composite device according to a thirteenth embodiment.

FIG. 45 is a sectional view of a package board 200L of a semiconductor composite device 10L according to a thirteenth embodiment. As shown, the package board 200L has a configuration similar to that of the package board 200D described in the sixth embodiment, and two package boards 200L-1 and 200L-2 share a through hole connected to the output terminal OUT, and are coupled in a plane direction.

In the sectional view of FIG. 45, the C layer of the package boards 200L-1 and 200L-2 has the via 222 and the conductive portion 220 that are connected to the anode electrode 232. In the C layer of the package board 200L-1, the via 222 and the conductive portion 220 are disposed on the side of the mounting face (e.g., a front face side) with respect to the capacitor portion 230. On the other hand, in the C layer of the package board 200L-2, the via 222 and the conductive portion 220 are disposed on the opposite side to the mounting face (e.g., a back face side) with respect to the capacitor portion 230. In other words, the C layer of the package board 200L-1 and the C layer of the package board 200L-2 are disposed so as to have a reverse configuration in the lamination direction.

Since each C layer of the package boards 200L-1 and 200L-2 has the conductive members (e.g., conductive portion 220, via 222) connected to the anode electrode 232 only on one face of the C layer, it has an asymmetric configuration in the lamination direction. For this reason, the coefficients of linear expansion differ between the front face and back face of the C layer, and the board may be warped due to a temperature change during the manufacturing process.

The package board 200L according to the thirteenth embodiment has a configuration in which the C layers in two adjacent package boards 200L-1 and 200L-2 are disposed so as to have a reverse configuration in the lamination direction. Thereby, the warpage direction of the package board 200L-1 and the warpage direction of the package board 200L-2 are opposite to each other, so that the deformation of the entire C layer is suppressed. Therefore, with the configuration of the C layer as illustrated in FIG. 45, warpage of the package board 200L can be suppressed.

Fourteenth Embodiment

Figure 46:
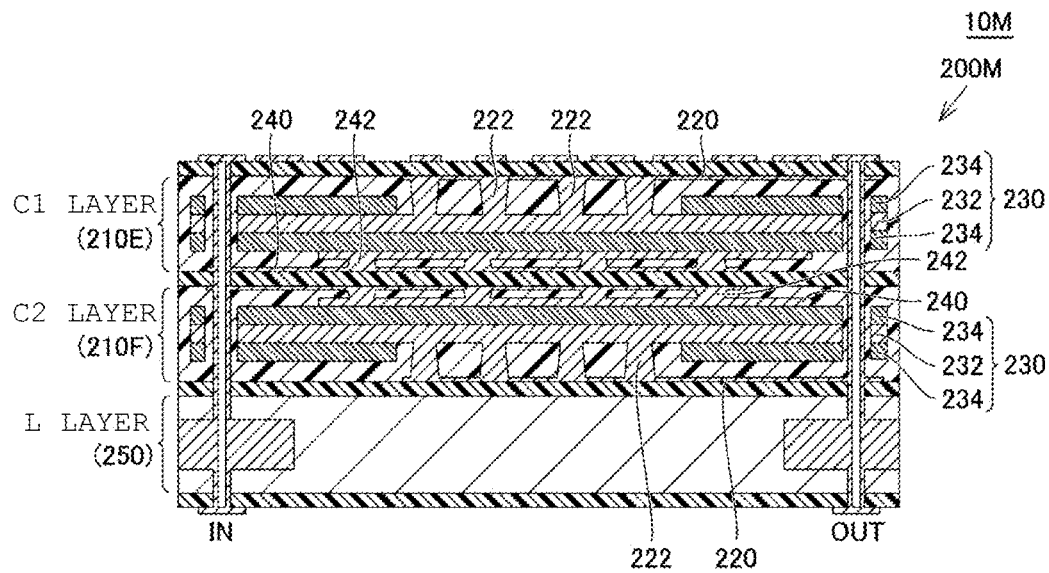
FIG. 46 is a first example of a sectional view of a semiconductor composite device according to a fourteenth embodiment.

FIG. 46 is a sectional view of a package board 200M of a semiconductor composite device 10M according to the fourteenth embodiment. As in the package board 100C described in the fifth embodiment, the package board 200M has a C1 layer 210E and a C2 layer 210F as the capacitor CP1. In the package board 200M, the C1 layer 210E, the C2 layer 210F, and the L layer 250 are laminated in this order from the mounting face side.

In the sectional view of FIG. 46, the via 222 and the conductive portion 220 that are connected to the anode electrodes 232 of the C1 layer 210E and the C2 layer 210F are illustrated. In the C1 layer 210E, the via 222 and the conductive portion 220 are disposed on the side of the mounting face with respect to the capacitor portion 230. On the other hand, in the C2 layer 210F, the via 222 and the conductive portion 220 are disposed on the opposite side to the mounting face with respect to the capacitor portion 230. In other words, the C1 layer 210E and the C2 layer 210F are disposed so as to have a reverse configuration in the lamination direction.

As described in the thirteenth embodiment, in the C layer, the coefficients of linear expansion differ between the front face and the back face of the C layer, and the board may be warped due to a temperature change during the manufacturing process.

In the package board 200M according to the fourteenth embodiment, the capacitor CP1 is formed of the two C layers 210E and 210F, and the two C layers are disposed so as to have a reverse configuration in the lamination direction. Accordingly, the warpage direction in the C layer 210E and the warpage direction in the C layer 210F are opposite to each other, so that the deformation of the entire C layer is suppressed. Therefore, with the configuration of the C layer as illustrated in FIG. 45, warpage of the package board 200M can be suppressed.

Figure 47:
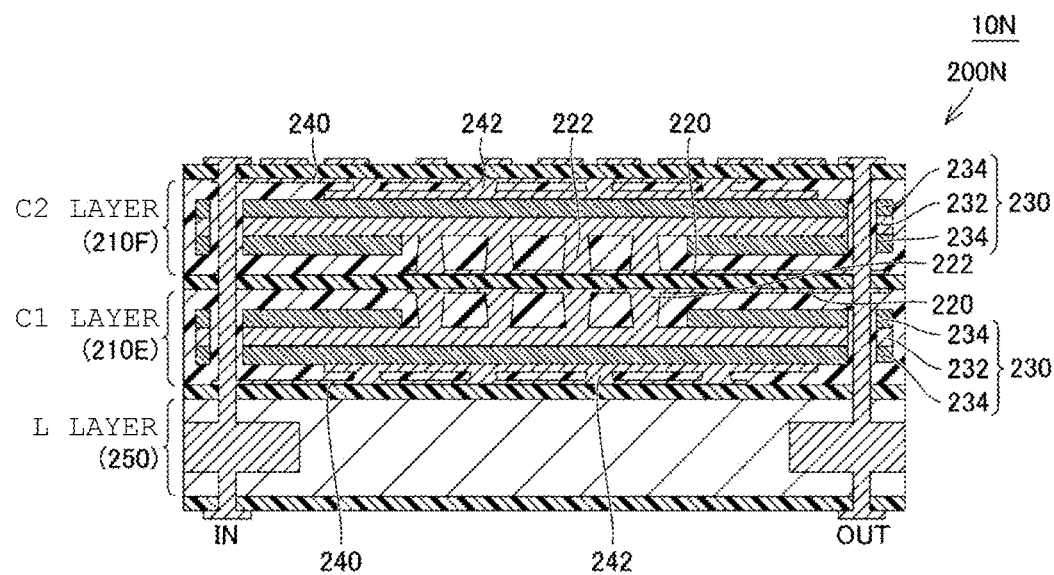
FIG. 47 is a second example of a sectional view of the semiconductor composite device according to the fourteenth embodiment.

As illustrated in FIG. 47, the C1 layer 210E and the C2 layer 210F may be laminated in reverse order.

In the fourteenth embodiment, the C1 layer 210E corresponds to the "first layer" in the present disclosure, the L layer 250 corresponds to the "second layer" in the present disclosure, and the C layer 210F corresponds to the "third layer" in the present disclosure.

It is noted that although the configuration in which the semiconductor composite device has the voltage regulator, the package board, and the load has been described in the above embodiment, the features of the embodiment are also applicable to a semiconductor composite device having a configuration including only the voltage regulator and the package board and a semiconductor composite device having a configuration including only the package board and the load as long as the configuration of the package board of the present embodiment is included.

Also, in the above description, for the arrangement of the C layer 210 and the L layer 250, the configuration in which the C layer 210 is disposed closer to the mounting face on which the load or the like is mounted has been described, but the L layer 250 may be disposed closer to the mounting face than the C layer 210.

In general, it is noted that each of the "through holes 266 to 268" in the present embodiment is an example of the "fourth through hole" in the present disclosure.

It should also be understood that the embodiments disclosed this time are in all respects illustrative and not restrictive. The scope of the present disclosure is defined by the terms of the claims, rather than the description of the embodiments, and is intended to include any modifications within the scope and meaning equivalent to the terms of the claims.

DESCRIPTION OF REFERENCE SYMBOLS 10, 10A to 10H, 10J to 10N, 10CA: semiconductor composite device
100: voltage regulator
105: active element
120, 380: solder bump
200, 200A to 200H, 200J to 200N, 200CA: package board
205, 205A to 205E: circuit layer
210, 210A to 210F: C layer
250: L layer
212: conductive layer 220, 240: conductive portion
222, 223, 242: via
225, 249, 254: insulating portion
226 to 229, 229A, 229B, 291 to 294: resin layer
230: capacitor portion
232: anode electrode
234: porous layer
235: cutout portion
236: cathode electrode
245, 245A, 245B, 280: core substrate
246, 247, 269, 269A to 269C: metal layer
252: coil portion
252#: Cu foil
260, 262, 264, 266, 267, 267A, 268: through hole
265, 296: resin
270, 270A: terminal layer
290: metallized layer
295: metal wiring layer
297: resist mask
300: load
350: electronic device
400: mother board
410: terminal
450: heat sink
CP1: capacitor
GND: ground terminal
IN: input terminal
L1: inductor
OUT: output terminal

The invention claimed is:

1. A semiconductor composite device comprising:
a voltage regulator including a semiconductor active element;
a package board having a mounting face for mounting a load to receive a converted DC voltage;
an inductor formed in the package board and electrically connected to the voltage regulator and the load; and
a capacitor formed in the package board and between the inductor and the mounting surface, wherein the capacitor and the inductor are formed in different layers of the package board, and wherein the inductor and the capacitor at least partially overlap with each other in the different layers when the package board is viewed in a plan view from a direction perpendicular to the mounting face.

2. The semiconductor composite device according to claim 1, wherein the inductor is connected between an input terminal and an output terminal of the package board.

3. The semiconductor composite device according to claim 2, wherein the inductor is connected to the voltage regulator at the input terminal and to the load at the output terminal.

4. The semiconductor composite device according to claim 2, wherein the package board comprises a plurality of through holes that extend in a direction perpendicular to the mounting face of the package board.

5. The semiconductor composite device according to claim 4, wherein a first through hole of the plurality of through holes corresponds to the input terminal, a second through hole of the plurality of through holes corresponds to the output terminal, and a third through hole of the plurality of through holes corresponds to a ground terminal.

6. The semiconductor composite device according to claim 5, wherein the first, second and third through holes are disposed at three corners, respectively, of the mounting face of the package board.

7. The semiconductor composite device according to claim 1, further comprising an inductor layer that includes a coil forming the inductor and an insulating portion in which a periphery of the coil is molded therein with a resin.

8. The semiconductor composite device according to claim 7, wherein the coil comprises a metal wiring formed by patterning a copper core material.

9. The semiconductor composite device according to claim 7, wherein the package board comprises a plurality of through holes that extend in a direction perpendicular to the mounting face of the package board.

10. The semiconductor composite device according to claim 8, wherein a first end of the coil is electrically connected to a first through hole of the plurality of through holes and a second end of the coil is electrically connected to a second through hole of the plurality of through holes.

11. The semiconductor composite device according to claim 10, wherein the first through hole is electrically connected to the voltage regulator and the second through is electrically connected to the load.

12. The semiconductor composite device according to claim 7, wherein the coil comprises a core material formed form aluminum.

13. The semiconductor composite device according to claim 7, wherein the inductor layer is formed by molding the coil with the insulating portion containing a magnetic material in the inductor layer where the inductor is formed.

14. The semiconductor composite device according to claim 1, wherein the package board further includes a circuit layer with a plurality of wiring patterns formed therein,
wherein the circuit layer is disposed on a first face of the capacitor,
wherein the mounting face is disposed at a face of the circuit layer that is remote from the capacitor.

15. The semiconductor composite device according to claim 14,
wherein the capacitor includes a first core substrate;
wherein the circuit layer includes a second core substrate with the voltage regulator formed in the circuit layer; and
wherein the load overlaps the voltage regulator when the package board is viewed in a plan view from a direction perpendicular to the mounting face.

16. The semiconductor composite device according to claim 1, wherein the voltage regulator, the inductor, and the capacitor are configured to form a chopper-type step-down switching regulator.

17. A semiconductor composite device comprising:
a voltage regulator including a semiconductor active element;
a package board having a mounting face; and
an inductor formed in the package board and electrically connected to the voltage regulator,
wherein the inductor is connected between an input terminal and an output terminal of the package board, and
wherein the inductor is connected to the voltage regulator at the input terminal and to a load at the output terminal, with the load being mounted to the mounting face to receive a converted DC voltage.

* * * * *